(12) United States Patent
Urtasun et al.

(10) Patent No.: US 12,103,554 B2
(45) Date of Patent: Oct. 1, 2024

(54) SYSTEMS AND METHODS FOR AUTONOMOUS VEHICLE SYSTEMS SIMULATION

(71) Applicant: Aurora Operations, Inc., Pittsburgh, PA (US)

(72) Inventors: Raquel Urtasun, Toronto (CA); Kelvin Ka Wing Wong, Toronto (CA); Qiang Zhang, Toronto (CA); Bin Yang, Toronto (CA); Ming Liang, Toronto (CA); Renjie Liao, Toronto (CA)

(73) Assignee: AURORA OPERATIONS, INC., Pittsburgh, PA (US)

(*) Notice: Subject to any disclaimer, the term of this patent is extended or adjusted under 35 U.S.C. 154(b) by 297 days.

(21) Appl. No.: 17/150,982

(22) Filed: Jan. 15, 2021

(65) Prior Publication Data
US 2021/0276587 A1 Sep. 9, 2021

Related U.S. Application Data

(60) Provisional application No. 63/111,913, filed on Nov. 10, 2020, provisional application No. 62/985,844, filed on Mar. 5, 2020.

(51) Int. Cl.
*B60W 60/00* (2020.01)
*B60W 50/00* (2006.01)
(Continued)

(52) U.S. Cl.
CPC .......... *B60W 60/001* (2020.02); *B60W 50/00* (2013.01); *G06F 30/27* (2020.01);
(Continued)

(58) Field of Classification Search
CPC .............. B60W 60/001; B60W 50/00; B60W 2050/0019; B60W 2050/0083; G06F 30/27; G06N 3/08
See application file for complete search history.

(56) References Cited

U.S. PATENT DOCUMENTS 10,169,680 B1 * 1/2019 Sachdeva ............. G06K 9/6256
11,150,660 B1 * 10/2021 Kabirzadeh .......... G05D 1/0214
(Continued)

FOREIGN PATENT DOCUMENTS

CN 109598066 A * 4/2019 ............. G06F 17/50

OTHER PUBLICATIONS

Seungje Yoon, "The multilayer perceptron approach to lateral motion prediction of surrounding vehicles for autonomous vehicles" 2016 (Year: 2016).*

(Continued)

*Primary Examiner* — Russell Frejd
*Assistant Examiner* — Brittany Renee Peko
(74) *Attorney, Agent, or Firm* — Dority & Manning, P.A.

(57) ABSTRACT

Systems and methods of the present disclosure are directed to a method. The method can include obtaining simplified scenario data associated with a simulated scenario. The method can include determining, using a machine-learned perception-prediction simulation model, a simulated perception-prediction output based at least in part on the simplified scenario data. The method can include evaluating a loss function comprising a perception loss term and a prediction loss term. The method can include adjusting one or more parameters of the machine-learned perception-prediction simulation model based at least in part on the loss function.

20 Claims, 7 Drawing Sheets

(51) Int. Cl.
  *G06F 30/27* (2020.01)
  *G06N 3/08* (2023.01)
(52) U.S. Cl.
  CPC ....... *G06N 3/08* (2013.01); *B60W 2050/0019* (2013.01); *B60W 2050/0083* (2013.01)

(56) References Cited

U.S. PATENT DOCUMENTS

| | | | |
|---|---|---|---|
| 11,577,741 B1* | 2/2023 | Reschka | B60W 50/045 |
| 2017/0123429 A1* | 5/2017 | Levinson | G05D 1/0214 |
| 2019/0129436 A1 | 5/2019 | Sun et al. | |
| 2019/0129831 A1* | 5/2019 | Goldberg | G06F 11/3664 |
| 2019/0147255 A1 | 5/2019 | Homayounfar et al. | |
| 2019/0163181 A1 | 5/2019 | Liu et al. | |
| 2019/0303725 A1* | 10/2019 | Gurvich | G06K 9/6262 |
| 2019/0384303 A1* | 12/2019 | Muller | G05D 1/0221 |
| 2020/0174490 A1* | 1/2020 | Ogale | G05D 1/0221 |
| 2021/0097148 A1* | 4/2021 | Bagschik | G06F 17/5009 |
| 2021/0114627 A1* | 4/2021 | McCurrie | B60W 60/0027 |
| 2021/0370980 A1* | 12/2021 | Ramamoorthy | B60W 60/0027 |
| 2022/0269279 A1* | 8/2022 | Redford | G05D 1/0221 |

OTHER PUBLICATIONS

Yu, F., Xian, W., Chen, Y., Liu, F., Liao, M., Madhavan, V., & Darrell, T. (2018). Bdd100k: A diverse driving video database with scalable annotation tooling. arXiv preprint arXiv:1805.04687, 2(5), 6. (Year: 2018).*
Akkaya et al, "Solving Rubik's Cube with a Robot Hand", arXiv:1910.07113v1, Oct. 16, 2019, 51 pages.
Alhaija et al, "Augmented Reality Meets Computer Vision: Efficient Data Generation for Urban Driving Scenes", arXiv:1708.01566v1, Aug. 4, 2017, 12 pages.
Bansal et al, "ChauffeurNet: Learning to Drive by Imitating the Best and Synthesizing the Worst", arXiv:1812.03079v1, Dec. 7, 2018, 20 pages.
Beattie et al, "DeepMind Lab", arXiv:1612.03801v2, Dec. 13, 2016, 11 pages.
Bellemare et al, "The Arcade Learning Environment: An Evaluation Platform for General Agents", arXiv:1207.4708v2, Jun. 21, 2013, 27 pages.
Bishop, "Pattern Recognition and Machine Learning", 758 pages.
Caesar et al, "nuScenes: A Multimodal Dataset for Autonomous Driving", arXiv:1903.11027v5, May 5, 2020, 16 pages.
Casas et al, "IntentNet: Learning to Predict Intention from Raw Sensor Data", arXiv:2101.07907v1, Jan. 20, 2021, 10 pages.
Chen et al, "DeepDriving: Learning Affordance for Direct Perception in Autonomous Driving", International Conference on Computer Vision, Dec. 11-18, 2015, Santiago, Chile, United States, pp. 2722-2730.
Coumans et al, "Pybullet", GitHub Repository, 2016.
Dosovitskiy et al, "CARLA: An Open Urban Driving Simulator", arXiv:1711.03938v1, Nov. 10, 2017, 16 pages.
Fang et al, "Simulating LiDAR Point Cloud for Autonomous Driving Using Real-World Scenes and Traffic Flows", arXiv:1811.07112v2, Apr. 10, 2019, 10 pages.
Gaidon et al, "Virtual Worlds as Proxy for Multi-Object Tracking Analysis", arXiv:1605.06457v1, May 10, 2016, 10 pages.
Geras et al, "Compressing LSTMs into CNNs", arXiv:1511.06433v1, Nov. 19, 2015, 11 pages.
Gschwandtner et al, "BlenSor: Blender Sensor Simulation Toolbox", International Symposium on Visual Computing, Lecture Notes in Computer Science, vol. 6939, 2011, 11 pages.
Gu et al, "A Lightweight Simulator for Autonomous Driving Motion Planning Development", International Conference on Information Systems, Dec. 13-16, 2015, Fort Worth, Texas, United States, 4 pages.
Gubelli, et al, "Ray-Tracing Simulator for Radar Signals Propagation in Radar Networks", European Radar Conference, Oct. 6-11, 2013, Nuremberg, Germany, 4 pages.
Guo et al, "Learning Monocular Depth by Distilling Cross-Domain Stereo Networks", arXiv:1808.06586v1, Aug. 20, 2018, 22 pages.
Gupta et al, "Cross Modal Distillation for Supervision Transfer", arXiv:1507.00448v2, Nov. 25, 2015, 14 pages.
Hinton et al, "Distilling the Knowledge in a Neural Network", arXiv:1503.02531v1, Mar. 9, 2015, 9 pages.
Johnson et al, "The Malmo Platform for Artificial Intelligence Experimentation", International Joint Conference on Artificial Intelligence, Jul. 9-16, 2016, New York, New York, United States, p. 4246-4247.
Kar et al, "Meta-Sim: Learning to Generate Synthetic Datasets", arXiv:1904.11621v1, Apr. 25, 2019, 14 pages.
Kempka et al, "ViZDoom: A Doom-Based AI Research Platform for Visual Reinforcement Learning", arXiv:1605.02097v2, Sep. 20, 2016, 8 pages.
Kingma et al, "Adam: A Method for Stochastic Optimization", arXiv:1412.6980v9, Jan. 30, 2017, 15 pages.
Koenig et al, "Design and Use Paradigms for Gazebo, an Open-Source Multi-Robot Simulator", International Conference on Intelligent Robots and Systems, Sep. 28-Oct. 2, 2004, Sendai, Japan, pp. 2149-2154.
Kolve et al, "AI2-THOR: An Interactive 3d Environment for Visual AI", arXiv:1712.05474v3, Mar. 15, 2019, 4 pages.
Liang et al, "PnPNet: End-to-End Perception and Prediction with Tracking in the Loop", Conference on Computer Vision and Pattern Recognition, Jun. 14-19, 2020, Virtual, pp. 11553-11562.
Manivasagam et al, "LiDARsim: Realistic LiDAR Simulation by Leveraging the Real World", arXiv:2006.09348v1, Jun. 16, 2020, 11 pages.
Mehta et al, "Active Domain Randomization", arXiv:1904.04762v2, Jul. 10, 2019, 15 pages.
Papernot et al, "Distillation as a Defense to Adversarial Perturbations Against Deep Neural Networks", arXiv:1511.04508v2, Mar. 14, 2016, 16 pages.
Peng et al, "Sim-to-Real Transfer of Robotic Control with Dynamics Randomization", arXiv:1710.06537v3, Mar. 3, 2018, 8 pages.
Pomerleau, "ALVINN: An Autonomous Land Vehicle in a Neural Network", Advances in Neural Information Processing Systems 1, pp. 305-313.
Pouyanfar et al, "Roads: Randomization for Obstacle Avoidance and Driving in Simulation", Conference on Computer Vision and Pattern Recognition, Jun. 16-20, 2019, Long Beach, California, United States, pp. 78-87.
Ros et al, "The SYNTHIA Dataset: A Large Collection of Synthetic Images for Semantic Segmentation of Urban Scenes", Conference on Computer Vision and Pattern Recognition, June 26-Jul. 1, 2016, Las Vegas, Nevada. United States, pp. 3234-3243.
Rusu et al, "Policy Distillation", arXiv:1511.06295v2, Jan. 7, 2016, 13 pages.
Sadat et al, "Jointly Learnable Behavior and Trajectory Planning for Self-Driving Vehicles", arXiv:1910.04586v1, Oct. 10, 2019, 8 pages.
Savva et al, "MINOS: Multimodal Indoor Simulator for Navigation in Complex Environments", arXiv:1712.03931v1, Dec. 11, 2017, 14 pages.
Shah et al, "AirSim: High-Fidelity Visual and Physical Simulation for Autonomous Vehicles", arXiv:1705.05065v2, Jul. 18, 2017, 14 pages.
Tessler et al, "A Deep Hierarchical Approach to Lifelong Learning in Minecraft", Conference on Artificial Intelligence, Feb. 4-9, 2017, San Francisco, California, United States, pp. 1553-1561.
Tobin et al, "Domain Randomization for Transferring Deep Neural Networks from Simulation to the Real World", arXiv:1703.06907v1, Mar. 20, 2017, 8 pages.
Todorov et al, "MuJoCo: A Physics Engine for Model-Based Control", International Conference on Intelligent Robots and Systems, Oct. 7-12, 2012, Vilamoura, Algarve, Portugal, 8 pages.
Wheeler et al, "Deep Stochastic Radar Models", arXiv:1701.09180v2, Jun. 16, 2017, 7 pages.
Wrenninge et al, "A Photorealistic Synthetic Dataset for Street Scene Parsing", arXiv:1810.08705v1, Oct. 19, 2018, 13 pages.

(56) References Cited

OTHER PUBLICATIONS

Wymann et al, "TORCS: The Open Racing Car Simulator", 5 pages.
Xia et al, "Gibson Env V2: Embodied Simulation Environments for Interactive Navigation", Technical Report, Stanford University, Jun. 16, 2019, 5 pages.
Xia et al, "Gibson Env: Real World Perception for Embodied Agents", arXiv:1808.10654v1, Aug. 31, 2018, 12 pages.
Yang et al, "Hdnet: Exploiting HD Maps for 3D Object Detection", arXiv:2012.11704v1, Dec. 21, 2020, 10 pages.
Yang et al, "PIXOR: Real-Time 3D Object Detection from Point Clouds", arXiv:1902.06326V3, Mar. 2, 2019, 10 pages.
Yue et al, "A LiDAR Point Cloud Generator: from a Virtual World to Autonomous Driving", arXiv:1804.00103v1, Mar. 31, 2018, 7 pages.
International Search Report and Written Opinion for Application No. PCT/US2021/019849, mailed Jun. 24, 2021, 14 pages.

\* cited by examiner

SYSTEMS AND METHODS FOR AUTONOMOUS VEHICLE SYSTEMS SIMULATION

RELATED APPLICATION

The present application is based on and claims benefit of U.S. Provisional Patent Application No. 63/111,913 having a filing date of Nov. 10, 2020, and U.S. Provisional Patent Application No. 62/985,844 having a filing date of Mar. 5, 2020, both of which are incorporated by reference herein.

FIELD

The present disclosure relates generally to vehicle services and, more particularly, safety testing using simulated autonomous vehicle systems.

BACKGROUND

An autonomous vehicle can be capable of sensing its environment and navigating without human input. In particular, an autonomous vehicle can observe its surrounding environment using a variety of sensors and can attempt to comprehend the environment by performing various processing techniques on data collected by the sensors. Given knowledge of its surrounding environment, the autonomous vehicle can identify an appropriate motion path for navigating through such a surrounding environment.

SUMMARY

Aspects and advantages of embodiments of the present disclosure will be set forth in part in the following description, or may be learned from the description, or may be learned through practice of the embodiments.

One example aspect of the present disclosure is directed to a computing system. The computing system can include one or more processors. The computing system can include a machine-learned perception-prediction simulation model configured to simulate a perception system and a prediction system of an autonomous vehicle. The machine-learned perception-prediction simulation model can include a perception submodel configured to process simplified scenario data to obtain simulated perception data. The machine-learned perception-prediction simulation model can include a prediction submodel configured to process the simplified scenario data and the simulated perception data to obtain simulated prediction data. The computing system can include one or more tangible, non-transitory computer readable media storing computer-readable instructions that when executed by the one or more processors cause the one or more processors to perform operations. The operations can include obtaining the simplified scenario data associated with a simulated scenario for the perception system and the prediction system of the autonomous vehicle. The operations can include determining, using the machine-learned perception-prediction simulation model, a simulated perception-prediction output based at least in part on the simplified scenario data, wherein the simulated perception-prediction output comprises the simulated perception data and the simulated prediction data. The operations can include providing the simulated perception-prediction output to a motion planning system of the autonomous vehicle. The operations can include, in response to providing the simulated perception-prediction output, obtaining a motion plan output from the motion planning system of the autonomous vehicle.

Another example aspect of the present disclosure is directed to a computer-implemented method. The method can include obtaining, by a computing system comprising one or more computing devices, simplified scenario data associated with a simulated scenario. The method can include determining, by the computing system using a machine-learned perception-prediction simulation model, a simulated perception-prediction output based at least in part on the simplified scenario data, wherein the simulated perception-prediction output comprises simulated perception data and simulated prediction data, wherein the machine-learned perception-prediction simulation model is configured to simulate a perception system and a prediction system of an autonomous vehicle. The method can include evaluating, by the computing system, a loss function comprising a perception loss term and a prediction loss term, wherein the perception loss term evaluates a difference between the simulated perception data and ground truth perception data and the prediction loss term evaluates a difference between the simulated prediction data and ground truth prediction data. The method can include adjusting, by the computing system, one or more parameters of the machine-learned perception-prediction simulation model based at least in part on the loss function.

Another example aspect of the present disclosure is directed to one or more tangible, non-transitory computer readable media storing computer-readable instructions that when executed by one or more processors cause the one or more processors to perform operations. The operations can include obtaining simplified scenario data that represents an intermediate output associated with a simulated scenario for a perception system and a prediction system of an autonomous vehicle. The operations can include processing the simplified scenario data with a perception submodel of a machine-learned perception-prediction simulation model to obtain simulated perception data, wherein the machine-learned perception-prediction simulation model is configured to simulate the perception system and the prediction system of the autonomous vehicle. The operations can include processing the simplified scenario data and the simulated perception data with a prediction submodel of the machine-learned perception-prediction simulation model to obtain simulated prediction data. The operations can include evaluating a loss function comprising a perception loss term and a prediction loss term, wherein the perception loss term evaluates a difference between the simulated perception data and ground truth perception data and the prediction loss term evaluates a difference between the simulated prediction data and ground truth prediction data. The operations can include adjusting one or more parameters of the machine-learned perception-prediction simulation model based at least in part on the loss function.

Other example aspects of the present disclosure are directed to other systems, methods, vehicles, apparatuses, tangible non-transitory computer-readable media, and the like for vehicle-device pairing.

The autonomous vehicle technology described herein can help improve the safety of passengers of an autonomous vehicle, improve the safety of the surroundings of the autonomous vehicle, improve the experience of the rider and/or operator of the autonomous vehicle, as well as provide other improvements as described herein. Moreover, the autonomous vehicle technology of the present disclosure can help improve the ability of an autonomous vehicle to effectively provide vehicle services to others and support the various members of the community in which the autonomous vehicle is operating, including persons with reduced mobility and/or persons that are underserved by other transportation options. Additionally, the autonomous vehicle of the present disclosure may reduce traffic congestion in communities as well as provide alternate forms of transportation that may provide environmental benefits.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
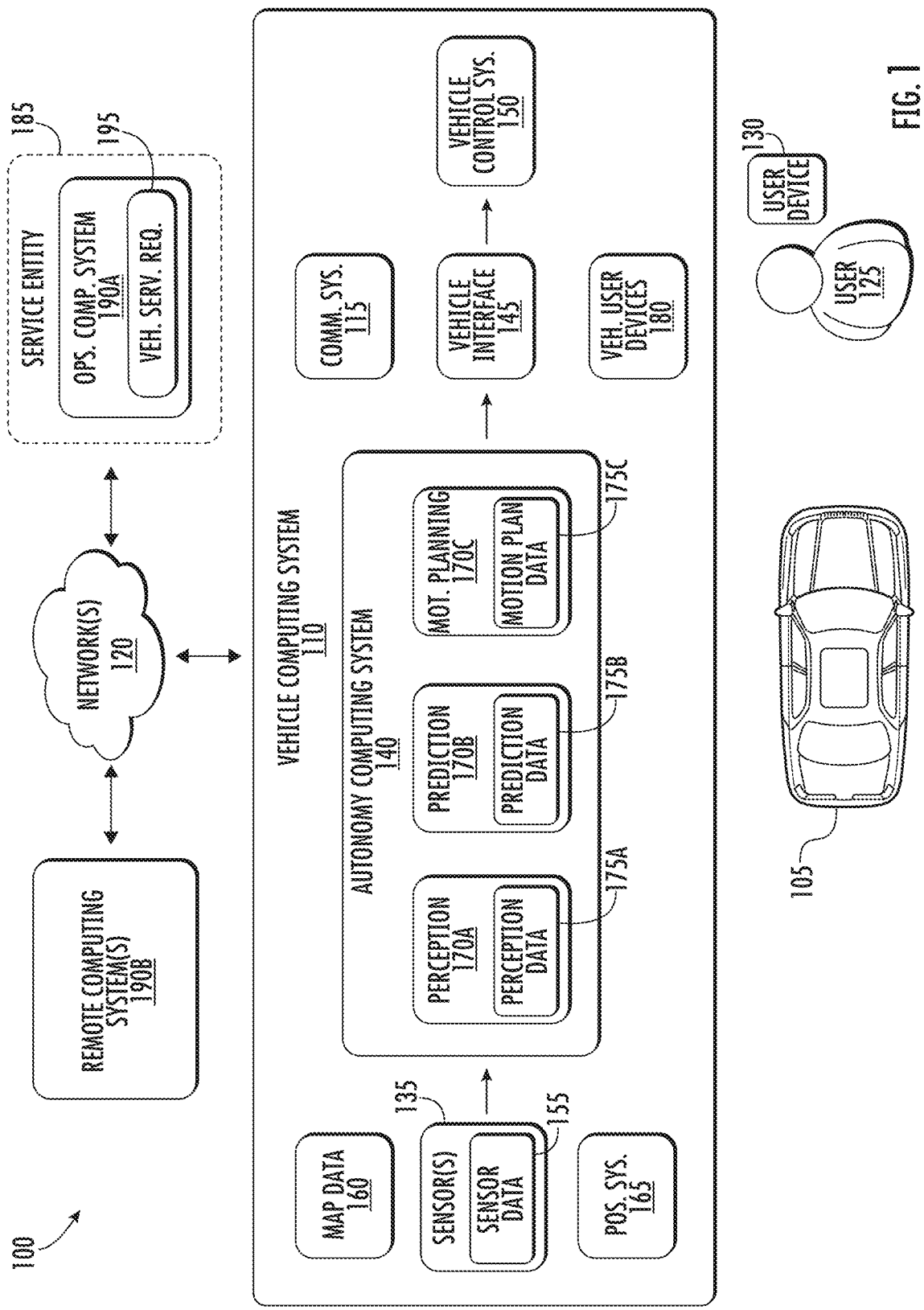
FIG. 1 depicts a block diagram of an example autonomous vehicle computing system according to example embodiments of the present disclosure.

Example aspects of the present application are directed to simulation of perception and prediction tasks for autonomous vehicles. More particularly, the systems and methods of the present disclosure utilize simplified, accurate, and easily-generated scenario data in place of sensor data to generate perception and prediction outputs for autonomous vehicle systems testing (e.g., motion planning system(s), etc.). As an example, simplified scenario data can be obtained that represents a simulated autonomous driving scenario for an autonomous vehicle (e.g., detecting an object at a crosswalk, predicting object movement, etc.). Unlike sensor data conventionally used to test autonomous vehicle systems, which can be difficult to acquire in a large scale, simplified scenario data can be created quickly, efficiently, and accurately. Using a machine-learned perception-prediction simulation model (e.g., a model trained to simulate perception and prediction outputs of an autonomous vehicle, etc.), a simulated perception-prediction output can be determined for the simplified scenario data (e.g., simulated perception data, simulated prediction data, etc.). The simulated perception-prediction output can be provided to a motion planning system of an autonomous vehicle to obtain a motion plan output. The motion plan output can be evaluated to determine a performance of the motion planning system (e.g., safety, accuracy, efficiency, etc.), and the motion planning system of the autonomous vehicle can then be optimized based on its performance. In such fashion, by obviating the inefficiencies associated with sensor data collection, autonomous vehicle system(s) can be tested and optimized efficiently and accurately across a broad variety of autonomous driving scenarios.

More particularly, autonomous vehicle perception and prediction systems may generally be tested using sensor data. As an example, the perception and prediction systems can obtain raw sensor data (e.g., LIDAR data, image data, etc.) and high definition mapping data (e.g., HD maps, etc.) as input from a sensor reading at timestep t. After receiving this data, the perception and prediction systems can output a class label $\hat{c}_i$ (e.g., labeling a perceived object as belonging to a certain class, etc.), a bird's-eye-view (BEV) bounding box $\hat{c}_i$, and a set of future states $\hat{s}_i = \{\hat{s}_{i,t+\delta}\}_{\delta=1}^{H}$ for every object i detected in the area about the autonomous vehicle given a prediction horizon H. Each state $\hat{s}_i = \{\hat{s}_{i,t+\delta}\}_{\delta=1}^{H}$ can be or otherwise include a 2D birds-eye-view waypoint that indicates the object's position at some timestep t+δ occurring in the future. It should be noted that this can be considered a conventional output parameterization of an autonomous vehicle's perception and predictions systems.

Rather than utilizing raw sensor data, simplified scenario data can be obtained that is associated with or otherwise represents an autonomous vehicle driving scenario. In some implementations, the simplified scenario can be or otherwise include an intermediate output associated with a scenario for a perception and a prediction system of an autonomous vehicle. As an example, autonomous vehicle perception and prediction systems can generally receive sensor data (e.g., LIDAR sensors, ultrasonic sensors, image sensors, etc.) and generate intermediate outputs that represent or otherwise describe an environment and any actors about the autonomous vehicle (e.g., objects, transportation network segments, weather, etc.). The simplified scenario data can represent an intermediate output of the perception and prediction systems of the autonomous vehicle.

As an example, the simplified scenario data can be or otherwise include a traffic scenario W, which can include high-definition mapping data M, a set of actor and/or object representations located within the area of the transportation network A (e.g., an object class label and an associated bounding box, etc.), and metadata that describes the autonomous vehicle's starting state and desired route. In some implementations, the high-definition mapping data M can include semantic information regarding the transportation network traversed by the autonomous vehicle (e.g., lane boundaries, drivable surfaces, intersections, traffic lights, signs, etc.). Each actor $a_i \in A$ can be represented by a class label $c_i$ and a sequence of bounding boxes $b_i = \{b_{i,t}\}_{t=0}^{T}$, where T can represent the number of timesteps over a scenario's duration. In such fashion, one can view the simplified scenario data W as a sequence of frames $\{W_t\}_{t=0}^{T}$, where the i-th actor in each frame $W_t$ can be represented in the output parameterization of a perception and prediction system (e.g., a class label $c_i$, a bounding box $b_i$, a set of future states $\{\hat{s}_{i,t=\delta}\}_{\delta=1}^{H}$ etc.).

It should be noted that by representing the scenario using intermediate representations of objects and other data, the simplified scenario data can be easily generated and utilized. As an example, the bounding boxes $b_i = \{b_{i,t}\}_{t=0}^{T}$ of the simplified scenario data can be quickly and accurately sketched by a user. As another example, a user (e.g., test engineer, etc.) can generate class label $c_i$ for bounding boxes $b_i$ in a matter of minutes (e.g., depending on the relative complexity of the scenario, the duration of the scenario, etc.). As yet another example, a user could sketch a trajectory for an object identified by a bounding box $b_i$ to indicate movement of the object over a plurality of future time steps T. In such fashion, simplified scenario data provides for an accurate and efficient platform for creation of varied autonomous driving scenarios without the need for sensor data collection or simulation.

Based at least in part on the simplified simulation data, a simulated perception-prediction output can be determined using a machine-learned perception-prediction simulation model. The simulated perception-prediction output can include simulated perception data (e.g., a simulated perception output of an autonomous vehicle perception system) and simulated prediction data (e.g., a simulated prediction output of an autonomous vehicle prediction system). More particularly, the machine-learned perception-prediction simulation model can be configured to simulate the perception and prediction systems of the autonomous vehicle, and can be utilized to process a particular frame $W_t$ of the simplified scenario data that includes birds-eye-view raster images of the environment about the autonomous vehicle (e.g., from an ego-centric perspective of the autonomous vehicle, etc.). As an example, for each class of interest (e.g., persons, vehicles, etc.) actors associated with each class can be rendered in a temporal sequence of occupancy masks.

In some implementations, this rasterization can be performed for time periods occurring previously to the particular frame $W_t$ and for time periods occurring subsequently to the particular frame. For example, the occupancy masks can be rendered 0.5 seconds into the previously and 3.0 seconds subsequently. Additionally, or alternatively, in some implementations the high-definition mapping data can be rasterized into multiple binary images and processed alongside the birds-eye-view raster images using the machine-learned perception-prediction simulation model. As an example, the lane boundaries of a transportation network can be rasterized (e.g., as polylines, etc.), and drivable surfaces and intersections can be represented as filled polygons from a birds-eye-view of the environment.

It should be noted that generally, occlusion can act as a source of systemic errors for conventional autonomous vehicle perception and prediction systems. As an example, a heavily occluded pedestrian (e.g., from the perspective of the autonomous vehicle, etc.) is generally more likely to be mis-detected by these systems. However, conventionally simulated sensor data fails to account for the errors associated with occlusion. As such, by representing occlusion, systems and methods of the present disclosure can also simulate the errors associated with occlusion, therefore facilitating accurate testing and simulation of autonomous vehicle systems.

To represent occlusion within the simplified scenario data, a temporal sequence of two-dimensional occlusion masks can, in some implementations, be rendered and included in the simplified scenario data. As an example, prior to determining a simulated perception-prediction output, a constant-horizon ray-casting algorithm can be utilized to determine one or more occlusion masks based at least in part on the location of at least the autonomous vehicle within the area of the transportation network (e.g., a temporal sequence of 2D occlusion masks for 0.5 seconds into the "past"). In some implementations, these one or more occlusion masks can be included in the simplified scenario data.

Using the machine-learned perception-prediction simulation model, a simulated perception-prediction output can be determined that includes simulated perception data and simulated prediction data. As an example, the machine-learned perception-prediction simulation model can first process the simplified scenario using a feature extraction portion of the model. For example, the machine-learned perception-prediction simulation model can perform feature extraction hierarchically at various scales of input resolution (e.g., ¼, ⅛, 1/16, etc.). These variously scaled and extracted features can be upscaled to a particular resolution (e.g., ¼, ⅛, etc.) and fused using one or more residual connections of the machine-learned perception-prediction simulation model. After fusion, a birds-eye-view feature map $\mathcal{F}_{BEV}(W_t,M) = CNN_{BEV}(W_t,M)$ can be obtained.

With the determined birds-eye-view feature map $\mathcal{F}_{BEV}(W_t,M) = CNN_{BEV}(W_t,M)$, the feature map can be processed to determine the simulated perception-prediction output. In some implementations, the machine-learned perception-prediction simulation model can include or otherwise utilize a dual-head perception-prediction architecture that includes a perception submodel and a prediction submodel. Using this architecture, the simulated perception data of the simulated perception-prediction output can be determined using the perception submodel, and the simulated prediction data of the simulated perception-prediction output can be determined using the prediction submodel. Alternatively, in some implementation, the machine-learned perception-prediction simulation model can include or otherwise utilize an architecture that determines simulated perception data and simulated prediction data jointly and simultaneously to determine the simulated perception-prediction output (e.g., using an architecture other than a dual-head perception and prediction architecture, etc.).

In some implementations, the perception submodel (e.g., a convolutional neural network, one or more convolutional layer(s), etc.) of the machine-learned perception-prediction simulation model can be used to determine the simulated perception data of the simulated perception-prediction output based at least in part on the simplified scenario data. The simulated perception data can, in some implementations, include predicted bounding boxes for each class of a plurality of object classes at every birds-eye-view pixel in the extracted feature map $\mathcal{F}_{BEV}(W_t,M)$ (e.g., vehicle(s), pedestrian(s), animal(s), obstruction(s), etc.). More particularly, for each class of interest (e.g., object class(es), etc.), a bounding box $\tilde{b}_i$ and detection score $\tilde{a}_i$ can be predicted at every birds-eye-view pixel i of the birds-eye-view feature map $\mathcal{F}_{BEV}(W_t,M)$. The predicted bounding box $\tilde{b}_i$ can be parameterized as $(\Delta x_i, \Delta y_i, \log w_i, \log h_i, \sin \theta_i, \cos \theta_i)$, where $\Delta x_i, \Delta y_i$ can represent the position offsets to the box center of the predicted bounding box $\tilde{b}_i$. $(w_i,h_i)$ can represent the width and height of the bounding box, and $\theta_i$ can represent the heading angle of the bounding box. In some implementations, all predicted bounding boxes $\tilde{b}_i$ can be kept above a score threshold $\tau=0$, and non-maximum suppression can be applied to remove all duplicate bounding boxes to obtain the simulated perception data (e.g., a set of simulated bounding boxes $\beta_{sim}(W_t,M) = \{\tilde{b}_i\}_{i=1}^N$, etc.) from the perception submodel of the machine-learned perception-prediction simulation model.

Similarly, in some implementations, the prediction submodel (e.g., a multi-layer perceptron, etc.) can be utilized to determine the simulated prediction data of the simulated perception-prediction output based at least in part on the simplified scenario data and the simulated perception data $\beta_{sim}(W_t,M)$. In some implementations, this simulated prediction data can include a simulated set of future states for each bounding box $\tilde{b}_1 \in \beta_{sim}(W_t,M)$ by determining one or more feature vectors respectively descriptive of the one or more simulated bounding boxes $\beta_{sim}(W_t,M)$.

As an example, for each bounding box of $\beta_{sim}(W_t,M)$, a feature vector $f_i$ can be respectively determined for the bounding box $\tilde{b}_i$ by bilinearly interpolating the extracted feature map $F_{BEV}(W_t,M)$ around the box center of the bounding box $\tilde{b}_i$. Based on the one or more feature vectors, the prediction submodel can be used to determine the simulated prediction data that includes one or more future state predictions for each of the one or more simulated bounding boxes. As an example, for each of the extracted feature vector(s), the prediction submodel (e.g., a multi-layer perceptron, a model including a multi-layer perceptron component, etc.) can simulate future states $\tilde{s}_i = MLP_{pred}(f_i)$, where $\tilde{s}_i \in \mathbb{R}^{T \times 2}$ can represent a set of 2D waypoints over a prediction horizon T.

In some implementations, the future state prediction(s) for bounding boxes can be based at least in part on previous future state predictions. As an example, the one or more simulated bounding boxes $\beta_{sim}(W_t,M)$ can be or otherwise include a plurality of simulated bounding boxes. A future state prediction for a first simulated bounding box $\tilde{b}_1$ can be based at least in part on a future state prediction for a second simulated bounding box $\tilde{b}_2$. By simulating the future states $\tilde{s}_i$, a set of future states $S_{sim}(W_t,M)=\{\tilde{s}_i\}_{i=1}^N$ can be determined. In such fashion, the final simulated perception-prediction output can be or otherwise include the combination of the simulated prediction data $S_{sim}(W_t,M)$ and the simulated perception data $\beta_{sim}(W_t,M)$.

As described previously, it should be noted that the dense output parameterization of the feature map $F_{BEV}(W_t,M)$ allows for the handling and simulation of false positive and/or false negative misdetections that are inherent to conventional perception and prediction systems. As an example, a perception output of a conventional perception system can include one or more falsely detected bounding boxes (e.g., a false positive bounding box, a false negative bounding box, etc.). Similarly, based on the dense output parameterization, at least one of the one or more simulated bounding boxes $\beta_{sim}(W_t,M)$ of the simulated perception data can include one or more simulated falsely detected bounding box(es) (e.g., a simulated false positive bounding box, etc.). In such fashion, the simulated bounding boxes, and therefore the simulated perception-prediction output, can accurately model the errors (e.g., false detection of bounding boxes, etc.) inherent to conventional perception-prediction systems.

A loss function can be evaluated that includes a perception loss term and a prediction loss term. The perception loss term can evaluate a difference between the simulated perception data and ground truth perception data. Similarly, the prediction loss term can evaluate a difference between the simulated prediction data and ground truth prediction data. In some implementations, the ground truth perception data can include a perception output of a perception system of an autonomous vehicle, and the ground truth prediction data can include a prediction output of a prediction system of an autonomous vehicle. The perception output and prediction output can be based at least in part on sensor data associated with the simulated scenario. As an example, the simplified scenario data can represent a simulated scenario for which sensor data is already available (e.g., collected real-time sensor data, simulated sensor data, etc.). The sensor data can be provided to a perception and prediction system of an autonomous vehicle, and in response, the perception output and the prediction output of the ground truth data can be obtained. As such, the loss function can evaluate the difference between the outputs of the simulated perception-prediction system (e.g., the machine-learned perception-prediction simulation model) and a conventionally implemented perception-prediction system of an autonomous vehicle. In such fashion, the loss function can be utilized to distill the knowledge of the perception and prediction systems of the autonomous vehicle to the machine-learned perception-prediction simulation model.

More particularly, as an example, the loss function can be or otherwise include a multi-task loss function $L(\varphi)=l_{perc}(\varphi)+l_{pred}(\varphi)$, where $l_{perc}(\varphi)$ can represent the perception loss term and $l_{pred}(\varphi)$ can represent the prediction loss term. In some implementations, the perception loss term can be or otherwise include a standard multi-task detection loss. For object classification, a binary cross-entropy can be utilized with online negative hard-mining, where positive and negative birds-eye-view pixels are determined according to their distances to an object's center. In some implementations, with box regression a smooth $l_1$ loss can be utilized for box orientation, and an axis-aligned intersection-over-union (IoU) loss can be utilized for predicted box locations and sizes.

In some implementations, the prediction loss term can evaluate a sum of smooth $l_1$ losses over future way points for each positive sample. As an example, a sample can be determined to be positive if the intersection-over-union (IoU) of the sample with a ground truth box exceeds a certain threshold (e.g., a threshold of 0.5 for vehicles, a threshold of 0.3 for bicyclists and/or pedestrians, etc.).

One or more parameters of the machine-learned perception-prediction simulation model can be adjusted based at least in part on the loss function. More particularly, the differences evaluated by the perception loss term and the prediction loss term can be backpropagated through the machine-learned perception-prediction simulation model to determine values associated with one or more parameters of the machine-learned perception-prediction simulation model to be updated. The one or more parameters can be updated to reduce the difference evaluated by the loss function (e.g., using a gradient descent algorithm). In such fashion, the model(s) can be trained to simulate the outputs of perception, prediction, and/or perception-prediction system(s) of an autonomous vehicle through knowledge distillation.

Once trained, the machine-learned perception-prediction simulation model can be utilized to simulate a perception system and a prediction system of an autonomous vehicle. More particularly, perception and prediction outputs simulated by the machine-learned perception-prediction simulation model can be utilized to test the safety and efficiency of various autonomous vehicle systems (e.g., autonomous vehicle motion planning system(s), etc.).

As an example, a computing system (e.g., an autonomous vehicle computing system, an operations computing system of a service entity, etc.) can obtain simplified scenario data (e.g., additional simplified scenario data, etc.) that describes a scenario (e.g., an additional scenario different than the previously described scenario). The machine-learned perception-prediction simulation model can be utilized to determine a simulated perception-prediction output (e.g., simulated perception data, simulated prediction data, etc.) based at least in part on the simplified scenario data.

The simulated perception-prediction output can be provided to a motion planning system of an autonomous vehicle (e.g., via one or more network(s), etc.). The motion planning system can be a system configured to generate a motion plan output based at least in part on the simulated perception-prediction output. As an example, if the simulated perception-prediction output indicates an obstruction in front of the autonomous vehicle (e.g., a stopped vehicle, a minor collision, etc.), the motion plan can describe a series of movements over time that, when implemented by the vehicle, are configured to avoid the obstruction.

In response to providing the simulated perception-prediction output to the motion planning system of the autonomous vehicle, the computing system can obtain a motion plan output from the motion planning system of the autonomous vehicle. In some implementations, the computing system can determine a performance metric (e.g., safety, efficiency, etc.) associated with the motion plan output. As an example, the simulated perception-prediction output can indicate an obstruction in front of the autonomous vehicle. The motion plan can describe a series of movements over time that, when implemented by the vehicle, are configured to avoid the obstruction. The computing system can then determine a safety metric that evaluates a level of performance associated with the series of movements described by the motion plan (e.g., a level of safety, a level of efficiency, etc.). The performance metric can be determined by the computing system in a variety of ways. As an example, the performance metric can be determined using one or more simulation techniques (e.g., machine-learned simulation model(s), etc.). As another example, the performance metric can be determined by implementing the motion plan output via the autonomous vehicle (e.g., in a simulated environment, etc.).

In some implementations, the motion planning system of the autonomous vehicle can include one or more machine-learned motion planning models. The computing system can evaluate a loss function that evaluates a difference between the motion plan output of the autonomous vehicle and a ground truth label. The ground truth label can be or otherwise describe an optimal motion plan for the autonomous vehicle based on the simulated perception-prediction output. In some implementations, based at least in part on the loss function, the computing system can determine one or more parameter adjustments for at least one of the one or more machine-learned motion planning models. The one or more parameter adjustments can be provided to the motion planning system of the autonomous vehicle (e.g., via one or more network(s), etc.). The computing system of the autonomous vehicle can implement the one or more parameter adjustments to further optimize the motion planning system of the autonomous vehicle. In such fashion, the simulated perception-prediction output can be utilized to test and optimize a motion planning system of an autonomous vehicle, further increasing the safety and efficiency of the autonomous vehicle in autonomous driving scenarios.

In some implementations, the computing system can be or otherwise include a service entity computing system associated with a service entity that facilitates autonomous vehicle services. As an example, the service entity can facilitate provision of both first-party and third-party autonomous vehicle services (e.g., delivery services, transportation services, courier services, aerial transportation services, etc.). Additionally, in some implementations, the autonomous vehicle can be associated with the service entity (e.g., a first-party autonomous vehicle of the service entity, a third-party autonomous vehicle of a vehicle provider that provides services facilitated by the service entity, etc.). Alternatively, in some implementations, the computing system can be or otherwise include an autonomous vehicle computing system of the autonomous vehicle that is configured to implement various autonomous vehicle systems (e.g., motion planning system(s), perception system(s), prediction system(s), etc.).

It should be noted that the examples of the present disclosure are primarily described in the context of a ground-based autonomous vehicle merely to illustrate the various systems and methods of the present disclosure. Rather, the autonomous vehicle(s) of the present disclosure can be any sort or type of autonomous vehicle, including but limited to ground-based autonomous vehicles, water-based autonomous vehicles, and/or aerial autonomous vehicles (e.g., vertical take-off and landing vehicles, etc.). Additionally, in some implementations, systems and methods of the present disclosure can be utilized for non-autonomous vehicles and/or semi-autonomous vehicles.

Various means can be configured to perform the methods and processes described herein. For example, a computing system can include simplified scenario obtaining unit(s), simulated perception-prediction determination unit(s), loss function evaluation unit(s), parameter adjustment unit(s), and/or other means for performing the operations and functions described herein. In some implementations, one or more of the units may be implemented separately. In some implementations, one or more units may be a part of or included in one or more other units. These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry, for example. The means can include or otherwise be able to access memory such as, for example, one or more non-transitory computer-readable storage media, such as random-access memory, read-only memory, electrically erasable programmable read-only memory, erasable programmable read-only memory, flash/other memory device(s), data registrar(s), database(s), and/or other suitable hardware.

The means can be programmed to perform one or more algorithm(s) for carrying out the operations and functions described herein. For instance, the means can be configured to obtain simplified scenario data (e.g., representing an intermediate output associated with a scenario for a perception system and a prediction system of an autonomous vehicle, etc.). A simplified scenario obtaining unit is an example of means for obtaining simplified scenario data as described herein.

The means can be configured to determine a simulated perception-prediction output. For example, the means can be configured to utilize a machine-learned perception-prediction simulation model to determine, based on obtained simplified scenario data, a simulated perception-prediction output that includes simulated perception data and simulated prediction data. A simulated perception-prediction determination unit is one example of a means for determining a simulated perception-prediction output as described herein.

The means can be configured to evaluate a loss function. For example, the means can be configured to evaluate a loss function including a perception loss term that evaluates a difference between the simulated perception data and ground truth perception data and a prediction loss term that evaluates a difference between the simulated prediction data and ground truth prediction data. A loss function evaluation unit is one example of a means for evaluating a loss function as described herein.

The means can be configured to adjust one or more parameters of a machine-learned model. For example, the means can be configured to adjust one or more parameters of a machine-learned perception-prediction simulation model based at least in part on a loss function. A parameter adjustment unit is one example of a means for adjusting one or more parameters of a machine-learned model as described herein.

The present disclosure provides a number of technical effects and benefits. As one example technical effect and benefit, the collection and utilization of real sensor data for autonomous vehicle systems testing is generally considered prohibitively time-consuming and computationally expensive, and can therefore substantially limit the number of scenarios tested for various autonomous vehicle systems. Simulated sensor data can be generated more efficiently, but generally fails to account for the noise inherent to autonomous vehicle driving scenarios (e.g., false positive detections, false negative detections, etc.), and therefore cannot be used to accurately assess autonomous vehicle systems. Conversely, the simplified scenario data of the present disclosure is incredibly efficient to generate, while also fully accounting for the noise inherent to autonomous vehicle scenarios. By facilitating the utilization of simplified scenario data, systems and methods of the present disclosure can quickly, efficiently, and accurately test and evaluate a wide variety of autonomous vehicle driving scenarios, therefore substantially increasing the safety and computational performance of autonomous vehicles while obviating the time-consuming and computationally expensive collection of real sensor data.

With reference now to the FIGS., example aspects of the present disclosure will be discussed in further detail. FIG. 1 depicts a block diagram of an example system 100 for controlling and communicating with a vehicle according to example aspects of the present disclosure. As illustrated, FIG. 1 shows a system 100 that can include a vehicle 105 and a vehicle computing system 110 associated with the vehicle 105. The vehicle computing system 100 can be located onboard the vehicle 105 (e.g., it can be included on and/or within the vehicle 105).

The vehicle 105 incorporating the vehicle computing system 100 can be various types of vehicles. For instance, the vehicle 105 can be an autonomous vehicle. The vehicle 105 can be a ground-based autonomous vehicle (e.g., car, truck, bus, etc.). The vehicle 105 can be an air-based autonomous vehicle (e.g., airplane, helicopter, vertical take-off and lift (VTOL) aircraft, etc.). The vehicle 105 can be a light weight elective vehicle (e.g., bicycle, scooter, etc.). The vehicle 105 can be another type of vehicles (e.g., watercraft, etc.). The vehicle 105 can drive, navigate, operate, etc. with minimal and/or no interaction from a human operator (e.g., driver, pilot, etc.). In some implementations, a human operator can be omitted from the vehicle 105 (and/or also omitted from remote control of the vehicle 105). In some implementations, a human operator can be included in the vehicle 105.

The vehicle 105 can be configured to operate in a plurality of operating modes. The vehicle 105 can be configured to operate in a fully autonomous (e.g., self-driving) operating mode in which the vehicle 105 is controllable without user input (e.g., can drive and navigate with no input from a human operator present in the vehicle 105 and/or remote from the vehicle 105). The vehicle 105 can operate in a semi-autonomous operating mode in which the vehicle 105 can operate with some input from a human operator present in the vehicle 105 (and/or a human operator that is remote from the vehicle 105). The vehicle 105 can enter into a manual operating mode in which the vehicle 105 is fully controllable by a human operator (e.g., human driver, pilot, etc.) and can be prohibited and/or disabled (e.g., temporary, permanently, etc.) from performing autonomous navigation (e.g., autonomous driving, flying, etc.). The vehicle 105 can be configured to operate in other modes such as, for example, park and/or sleep modes (e.g., for use between tasks/actions such as waiting to provide a vehicle service, recharging, etc.). In some implementations, the vehicle 105 can implement vehicle operating assistance technology (e.g., collision mitigation system, power assist steering, etc.), for example, to help assist the human operator of the vehicle 105 (e.g., while in a manual mode, etc.).

To help maintain and switch between operating modes, the vehicle computing system 110 can store data indicative of the operating modes of the vehicle 105 in a memory onboard the vehicle 105. For example, the operating modes can be defined by an operating mode data structure (e.g., rule, list, table, etc.) that indicates one or more operating parameters for the vehicle 105, while in the particular operating mode. For example, an operating mode data structure can indicate that the vehicle 105 is to autonomously plan its motion when in the fully autonomous operating mode. The vehicle computing system 110 can access the memory when implementing an operating mode.

The operating mode of the vehicle 105 can be adjusted in a variety of manners. For example, the operating mode of the vehicle 105 can be selected remotely, off-board the vehicle 105. For example, a remote computing system (e.g., of a vehicle provider and/or service entity associated with the vehicle 105) can communicate data to the vehicle 105 instructing the vehicle 105 to enter into, exit from, maintain, etc. an operating mode. By way of example, such data can instruct the vehicle 105 to enter into the fully autonomous operating mode.

In some implementations, the operating mode of the vehicle 105 can be set onboard and/or near the vehicle 105. For example, the vehicle computing system 110 can automatically determine when and where the vehicle 105 is to enter, change, maintain, etc. a particular operating mode (e.g., without user input). Additionally, or alternatively, the operating mode of the vehicle 105 can be manually selected via one or more interfaces located onboard the vehicle 105 (e.g., key switch, button, etc.) and/or associated with a computing device proximate to the vehicle 105 (e.g., a tablet operated by authorized personnel located near the vehicle 105). In some implementations, the operating mode of the vehicle 105 can be adjusted by manipulating a series of interfaces in a particular order to cause the vehicle 105 to enter into a particular operating mode.

The vehicle computing system 110 can include one or more computing devices located onboard the vehicle 105. For example, the computing device(s) can be located on and/or within the vehicle 105. The computing device(s) can include various components for performing various operations and functions. For instance, the computing device(s) can include one or more processors and one or more tangible, non-transitory, computer readable media (e.g., memory devices, etc.). The one or more tangible, non-transitory, computer readable media can store instructions that when executed by the one or more processors cause the vehicle 105 (e.g., its computing system, one or more processors, etc.) to perform operations and functions, such as those described herein for controlling an autonomous vehicle, communicating with other computing systems, etc.

The vehicle 105 can include a communications system 115 configured to allow the vehicle computing system 110

(and its computing device(s)) to communicate with other computing devices. The communications system 115 can include any suitable components for interfacing with one or more network(s) 120, including, for example, transmitters, receivers, ports, controllers, antennas, and/or other suitable components that can help facilitate communication. In some implementations, the communications system 115 can include a plurality of components (e.g., antennas, transmitters, and/or receivers) that allow it to implement and utilize multiple-input, multiple-output (MIMO) technology and communication techniques.

The vehicle computing system 110 can use the communications system 115 to communicate with one or more computing device(s) that are remote from the vehicle 105 over one or more networks 120 (e.g., via one or more wireless signal connections). The network(s) 120 can exchange (send or receive) signals (e.g., electronic signals), data (e.g., data from a computing device), and/or other information and include any combination of various wired (e.g., twisted pair cable) and/or wireless communication mechanisms (e.g., cellular, wireless, satellite, microwave, and radio frequency) and/or any desired network topology (or topologies). For example, the network(s) 120 can include a local area network (e.g. intranet), wide area network (e.g. Internet), wireless LAN network (e.g., via Wi-Fi), cellular network, a SATCOM network, VHF network, a HF network, a WiMAX based network, and/or any other suitable communication network (or combination thereof) for transmitting data to and/or from the vehicle 105 and/or among computing systems.

In some implementations, the communications system 115 can also be configured to enable the vehicle 105 to communicate with and/or provide and/or receive data and/or signals from a remote computing device associated with a user 125 and/or an item (e.g., an item to be picked-up for a courier service). For example, the communications system 115 can allow the vehicle 105 to locate and/or exchange communications with a user device 130 of a user 125. In some implementations, the communications system 115 can allow communication among one or more of the system(s) on-board the vehicle 105.

As shown in FIG. 1, the vehicle 105 can include one or more sensors 135, an autonomy computing system 140, a vehicle interface 145, one or more vehicle control systems 150, and other systems, as described herein. One or more of these systems can be configured to communicate with one another via one or more communication channels. The communication channel(s) can include one or more data buses (e.g., controller area network (CAN)), on-board diagnostics connector (e.g., OBD-II), and/or a combination of wired and/or wireless communication links. The onboard systems can send and/or receive data, messages, signals, etc. amongst one another via the communication channel(s).

The sensor(s) 135 can be configured to acquire sensor data 155. The sensor(s) 135 can be external sensors configured to acquire external sensor data. This can include sensor data associated with the surrounding environment of the vehicle 105. The surrounding environment of the vehicle 105 can include/be represented in the field of view of the sensor(s) 135. For instance, the sensor(s) 135 can acquire image and/or other data of the environment outside of the vehicle 105 and within a range and/or field of view of one or more of the sensor(s) 135. The sensor(s) 135 can include one or more Light Detection and Ranging (LIDAR) systems, one or more Radio Detection and Ranging (RADAR) systems, one or more cameras (e.g., visible spectrum cameras, infrared cameras, etc.), one or more motion sensors, one or more audio sensors (e.g., microphones, etc.), and/or other types of imaging capture devices and/or sensors. The one or more sensors can be located on various parts of the vehicle 105 including a front side, rear side, left side, right side, top, and/or bottom of the vehicle 105. The sensor data 155 can include image data (e.g., 2D camera data, video data, etc.), RADAR data, LIDAR data (e.g., 3D point cloud data, etc.), audio data, and/or other types of data. The vehicle 105 can also include other sensors configured to acquire data associated with the vehicle 105. For example, the vehicle 105 can include inertial measurement unit(s), wheel odometry devices, and/or other sensors.

In some implementations, the sensor(s) 135 can include one or more internal sensors. The internal sensor(s) can be configured to acquire sensor data 155 associated with the interior of the vehicle 105. For example, the internal sensor(s) can include one or more cameras, one or more infrared sensors, one or more motion sensors, one or more weight sensors (e.g., in a seat, in a trunk, etc.), and/or other types of sensors. The sensor data 155 acquired via the internal sensor(s) can include, for example, image data indicative of a position of a passenger or item located within the interior (e.g., cabin, trunk, etc.) of the vehicle 105. This information can be used, for example, to ensure the safety of the passenger, to prevent an item from being left by a passenger, confirm the cleanliness of the vehicle 105, remotely assist a passenger, etc.

In some implementations, the sensor data 155 can be indicative of one or more objects within the surrounding environment of the vehicle 105. The object(s) can include, for example, vehicles, pedestrians, bicycles, and/or other objects. The object(s) can be located in front of, to the rear of, to the side of, above, below the vehicle 105, etc. The sensor data 155 can be indicative of locations associated with the object(s) within the surrounding environment of the vehicle 105 at one or more times. The object(s) can be static objects (e.g., not in motion) and/or dynamic objects/actors (e.g., in motion or likely to be in motion) in the vehicle's environment. The sensor(s) 135 can provide the sensor data 155 to the autonomy computing system 140.

In addition to the sensor data 155, the autonomy computing system 140 can obtain map data 160. The map data 160 can provide detailed information about the surrounding environment of the vehicle 105 and/or the geographic area in which the vehicle was, is, and/or will be located. For example, the map data 160 can provide information regarding: the identity and location of different roadways, road segments, buildings, or other items or objects (e.g., lampposts, crosswalks and/or curb); the location and directions of traffic lanes (e.g., the location and direction of a parking lane, a turning lane, a bicycle lane, or other lanes within a particular roadway or other travel way and/or one or more boundary markings associated therewith); traffic control data (e.g., the location and instructions of signage, traffic lights, and/or other traffic control devices); obstruction information (e.g., temporary or permanent blockages, etc.); event data (e.g., road closures/traffic rule alterations due to parades, concerts, sporting events, etc.); nominal vehicle path data (e.g., indicate of an ideal vehicle path such as along the center of a certain lane, etc.); and/or any other map data that provides information that assists the vehicle computing system 110 in processing, analyzing, and perceiving its surrounding environment and its relationship thereto. In some implementations, the map data 160 can include high definition map data. In some implementations, the map data 160 can include sparse map data indicative of a limited number of environmental features (e.g., lane boundaries, etc.). In some implementations, the map data can be limited to geographic area(s) and/or operating domains in which the vehicle 105 (or autonomous vehicles generally) may travel (e.g., due to legal/regulatory constraints, autonomy capabilities, and/or other factors).

The vehicle 105 can include a positioning system 165. The positioning system 165 can determine a current position of the vehicle 105. This can help the vehicle 105 localize itself within its environment. The positioning system 165 can be any device or circuitry for analyzing the position of the vehicle 105. For example, the positioning system 165 can determine position by using one or more of inertial sensors (e.g., inertial measurement unit(s), etc.), a satellite positioning system, based on IP address, by using triangulation and/or proximity to network access points or other network components (e.g., cellular towers, WiFi access points, etc.) and/or other suitable techniques. The position of the vehicle 105 can be used by various systems of the vehicle computing system 110 and/or provided to a remote computing system. For example, the map data 160 can provide the vehicle 105 relative positions of the elements of a surrounding environment of the vehicle 105. The vehicle 105 can identify its position within the surrounding environment (e.g., across six axes, etc.) based at least in part on the map data 160. For example, the vehicle computing system 110 can process the sensor data 155 (e.g., LIDAR data, camera data, etc.) to match it to a map of the surrounding environment to get an understanding of the vehicle's position within that environment. Data indicative of the vehicle's position can be stored, communicated to, and/or otherwise obtained by the autonomy computing system 140.

The autonomy computing system 140 can perform various functions for autonomously operating the vehicle 105. For example, the autonomy computing system 140 can perform the following functions: perception 170A, prediction 170B, and motion planning 170C. For example, the autonomy computing system 130 can obtain the sensor data 155 via the sensor(s) 135, process the sensor data 155 (and/or other data) to perceive its surrounding environment, predict the motion of objects within the surrounding environment, and generate an appropriate motion plan through such surrounding environment. In some implementations, these autonomy functions can be performed by one or more sub-systems such as, for example, a perception system, a prediction system, a motion planning system, and/or other systems that cooperate to perceive the surrounding environment of the vehicle 105 and determine a motion plan for controlling the motion of the vehicle 105 accordingly. In some implementations, one or more of the perception, prediction, and/or motion planning functions 170A, 170B, 170C can be performed by (and/or combined into) the same system and/or via shared computing resources. In some implementations, one or more of these functions can be performed via difference sub-systems. As further described herein, the autonomy computing system 140 can communicate with the one or more vehicle control systems 150 to operate the vehicle 105 according to the motion plan (e.g., via the vehicle interface 145, etc.).

The vehicle computing system 110 (e.g., the autonomy computing system 140) can identify one or more objects that within the surrounding environment of the vehicle 105 based at least in part on the sensor data 135 and/or the map data 160. The objects perceived within the surrounding environment can be those within the field of view of the sensor(s) 135 and/or predicted to be occluded from the sensor(s) 135. This can include object(s) not in motion or not predicted to move (static objects) and/or object(s) in motion or predicted to be in motion (dynamic objects/actors). The vehicle computing system 110 (e.g., performing the perception function 170C, using a perception system, etc.) can process the sensor data 155, the map data 160, etc. to obtain perception data 175A. The vehicle computing system 110 can generate perception data 175A that is indicative of one or more states (e.g., current and/or past state(s)) of one or more objects that are within a surrounding environment of the vehicle 105. For example, the perception data 175A for each object can describe (e.g., for a given time, time period) an estimate of the object's: current and/or past location (also referred to as position); current and/or past speed/velocity; current and/or past acceleration; current and/or past heading; current and/or past orientation; size/footprint (e.g., as represented by a bounding shape, object highlighting, etc.); class (e.g., pedestrian class vs. vehicle class vs. bicycle class, etc.), the uncertainties associated therewith, and/or other state information. The vehicle computing system 110 can utilize one or more algorithms and/or machine-learned model(s) that are configured to identify object(s) based at least in part on the sensor data 155. This can include, for example, one or more neural networks trained to identify object(s) within the surrounding environment of the vehicle 105 and the state data associated therewith. The perception data 175A can be utilized for the prediction function 175B of the autonomy computing system 140.

The vehicle computing system 110 can be configured to predict a motion of the object(s) within the surrounding environment of the vehicle 105. For instance, the vehicle computing system 110 can generate prediction data 175B associated with such object(s). The prediction data 175B can be indicative of one or more predicted future locations of each respective object. For example, the prediction system 175B can determine a predicted motion trajectory along which a respective object is predicted to travel over time. A predicted motion trajectory can be indicative of a path that the object is predicted to traverse and an associated timing with which the object is predicted to travel along the path. The predicted path can include and/or be made up of a plurality of way points. In some implementations, the prediction data 175B can be indicative of the speed and/or acceleration at which the respective object is predicted to travel along its associated predicted motion trajectory. The vehicle computing system 110 can utilize one or more algorithms and/or machine-learned model(s) that are configured to predict the future motion of object(s) based at least in part on the sensor data 155, the perception data 175A, map data 160, and/or other data. This can include, for example, one or more neural networks trained to predict the motion of the object(s) within the surrounding environment of the vehicle 105 based at least in part on the past and/or current state(s) of those objects as well as the environment in which the objects are located (e.g., the lane boundary in which it is travelling, etc.). The prediction data 175B can be utilized for the motion planning function 170C of the autonomy computing system 140.

The vehicle computing system 110 can determine a motion plan for the vehicle 105 based at least in part on the perception data 175A, the prediction data 175B, and/or other data. For example, the vehicle computing system 110 can generate motion planning data 175C indicative of a motion plan. The motion plan can include vehicle actions (e.g., speed(s), acceleration(s), other actions, etc.) with respect to one or more of the objects within the surrounding environment of the vehicle 105 as well as the objects' predicted movements. The motion plan can include one or more vehicle motion trajectories that indicate a path for the vehicle 105 to follow. A vehicle motion trajectory can be of a certain length and/or time range. A vehicle motion trajectory can be defined by one or more way points (with associated coordinates). The planned vehicle motion trajectories can indicate the path the vehicle 105 is to follow as it traverses a route from one location to another. Thus, the vehicle computing system 110 can take into account a route/route data when performing the motion planning function 170C.

The vehicle motion planning system can include an optimization algorithm, machine-learned model, etc. that considers cost data associated with a vehicle action as well as other objective functions (e.g., cost functions based on speed limits, traffic lights, etc.), if any, to determine optimized variables that make up the motion plan. The vehicle computing system 110 can determine that the vehicle 105 can perform a certain action (e.g., pass an object, etc.) without increasing the potential risk to the vehicle 105 and/or violating any traffic laws (e.g., speed limits, lane boundaries, signage, etc.). For instance, the vehicle computing system 110 can evaluate the predicted motion trajectories of one or more objects during its cost data analysis to help determine an optimized vehicle trajectory through the surrounding environment. The motion planning system 180 can generate cost data associated with such trajectories. In some implementations, one or more of the predicted motion trajectories and/or perceived objects may not ultimately change the motion of the vehicle 105 (e.g., due to an overriding factor). In some implementations, the motion plan may define the vehicle's motion such that the vehicle 105 avoids the object(s), reduces speed to give more leeway to one or more of the object(s), proceeds cautiously, performs a stopping action, passes an object, queues behind/in front of an object, etc.

The vehicle computing system 110 can be configured to continuously update the vehicle's motion plan and a corresponding planned vehicle motion trajectories. For example, in some implementations, the vehicle computing system 110 can generate new motion planning data 175C/motion plan(s) for the vehicle 105 (e.g., multiple times per second, etc.). Each new motion plan can describe a motion of the vehicle 105 over the next planning period (e.g., next several seconds, etc.). Moreover, a new motion plan may include a new planned vehicle motion trajectory. Thus, in some implementations, the vehicle computing system 110 can continuously operate to revise or otherwise generate a short-term motion plan based on the currently available data. Once the optimization planner has identified the optimal motion plan (or some other iterative break occurs), the optimal motion plan (and the planned motion trajectory) can be selected and executed by the vehicle 105.

The vehicle computing system 110 can cause the vehicle 105 to initiate a motion control in accordance with at least a portion of the motion planning data 175C. A motion control can be an operation, action, etc. that is associated with controlling the motion of the vehicle 105. For instance, the motion planning data 175C can be provided to the vehicle control system(s) 150 of the vehicle 105. The vehicle control system(s) 150 can be associated with a vehicle interface 145 that is configured to implement a motion plan. The vehicle interface 145 can serve as an interface/conduit between the autonomy computing system 140 and the vehicle control systems 150 of the vehicle 105 and any electrical/mechanical controllers associated therewith. The vehicle interface 145 can, for example, translate a motion plan into instructions for the appropriate vehicle control component (e.g., acceleration control, brake control, steering control, etc.). By way of example, the vehicle interface 145 can translate a determined motion plan into instructions to adjust the steering of the vehicle 105 "X" degrees, apply a certain magnitude of braking force, increase/decrease speed, etc. The vehicle interface 145 can help facilitate the responsible vehicle control (e.g., braking control system, steering control system, acceleration control system, etc.) to execute the instructions and implement a motion plan (e.g., by sending control signal(s), making the translated plan available, etc.). This can allow the vehicle 105 to autonomously travel within the vehicle's surrounding environment.

The vehicle computing system 110 can store other types of data. For example, an indication, record, and/or other data indicative of the state of the vehicle (e.g., its location, motion trajectory, health information, etc.), the state of one or more users (e.g., passengers, operators, etc.) of the vehicle, and/or the state of an environment including one or more objects (e.g., the physical dimensions and/or appearance of the one or more objects, locations, predicted motion, etc.) can be stored locally in one or more memory devices of the vehicle 105. Additionally, the vehicle 105 can communicate data indicative of the state of the vehicle, the state of one or more passengers of the vehicle, and/or the state of an environment to a computing system that is remote from the vehicle 105, which can store such information in one or more memories remote from the vehicle 105. Moreover, the vehicle 105 can provide any of the data created and/or store onboard the vehicle 105 to another vehicle.

The vehicle computing system 110 can include the one or more vehicle user devices 180. For example, the vehicle computing system 110 can include one or more user devices with one or more display devices located onboard the vehicle 105. A display device (e.g., screen of a tablet, laptop, and/or smartphone) can be viewable by a user of the vehicle 105 that is located in the front of the vehicle 105 (e.g., driver's seat, front passenger seat). Additionally, or alternatively, a display device can be viewable by a user of the vehicle 105 that is located in the rear of the vehicle 105 (e.g., a back passenger seat). The user device(s) associated with the display devices can be any type of user device such as, for example, a table, mobile phone, laptop, etc. The vehicle user device(s) 180 can be configured to function as human-machine interfaces. For example, the vehicle user device(s) 180 can be configured to obtain user input, which can then be utilized by the vehicle computing system 110 and/or another computing system (e.g., a remote computing system, etc.). For example, a user (e.g., a passenger for transportation service, a vehicle operator, etc.) of the vehicle 105 can provide user input to adjust a destination location of the vehicle 105. The vehicle computing system 110 and/or another computing system can update the destination location of the vehicle 105 and the route associated therewith to reflect the change indicated by the user input.

The vehicle computing system 110 can, in some implementations, be or otherwise represent a simulation of a vehicle computing system. More particularly, the vehicle computing system 110, and/or various subsystems of the vehicle computing system 110 (e.g., autonomy computing system 140, perception system 170A, prediction system 170B, motion planning system 170C, etc.) can be or otherwise include simulated representations of the vehicle computing system. As example, the machine-learned perception-prediction simulation model can be or otherwise represent one or more of the subsystems of the vehicle computing system 110 (e.g., the perception system 170A, the prediction system 170B, etc.). As another example, any outputs of an autonomous vehicle utilized in the present disclosure (e.g., ground truth perception data, ground truth prediction data, etc.) can be outputs of the vehicle computing system 110 or outputs of a simulated vehicle computing system 110. For example, the ground truth perception data can include perception data 175A of the perception system 170A of the vehicle computing system 110. For another example, the ground truth prediction data can include prediction data 175B of the prediction system 170B of the vehicle computing system 110. In such fashion, any of the systems and/or subsystems of the vehicle computing system 110 can be or otherwise include a simulated representation of the systems and/or subsystems.

The vehicle 105 can be configured to perform vehicle services for one or a plurality of different service entities 185. A vehicle 105 can perform a vehicle service by, for example and as further described herein, travelling (e.g., traveling autonomously) to a location associated with a requested vehicle service, allowing user(s) and/or item(s) to board or otherwise enter the vehicle 105, transporting the user(s) and/or item(s), allowing the user(s) and/or item(s) to deboard or otherwise exit the vehicle 105, etc. In this way, the vehicle 105 can provide the vehicle service(s) for a service entity to a user.

A service entity 185 can be associated with the provision of one or more vehicle services. For example, a service entity can be an individual, a group of individuals, a company (e.g., a business entity, organization, etc.), a group of entities (e.g., affiliated companies), and/or another type of entity that offers and/or coordinates the provision of one or more vehicle services to one or more users. For example, a service entity can offer vehicle service(s) to users via one or more software applications (e.g., that are downloaded onto a user computing device), via a website, and/or via other types of interfaces that allow a user to request a vehicle service. As described herein, the vehicle services can include transportation services (e.g., by which a vehicle transports user(s) from one location to another), delivery services (e.g., by which a vehicle transports/delivers item(s) to a requested destination location), courier services (e.g., by which a vehicle retrieves item(s) from a requested origin location and transports/delivers the item to a requested destination location), and/or other types of services. The vehicle services can be wholly performed by the vehicle 105 (e.g., travelling from the user/item origin to the ultimate destination, etc.) or performed by one or more vehicles and/or modes of transportation (e.g., transferring the user/item at intermediate transfer points, etc.).

An operations computing system 190A of the service entity 185 can help to coordinate the performance of vehicle services by autonomous vehicles. The operations computing system 190A can include and/or implement one or more service platforms of the service entity. The operations computing system 190A can include one or more computing devices. The computing device(s) can include various components for performing various operations and functions. For instance, the computing device(s) can include one or more processors and one or more tangible, non-transitory, computer readable media (e.g., memory devices, etc.). The one or more tangible, non-transitory, computer readable media can store instructions that when executed by the one or more processors cause the operations computing system 190 (e.g., its one or more processors, etc.) to perform operations and functions, such as those described herein matching users and vehicles/vehicle fleets, deploying vehicles, facilitating the provision of vehicle services via autonomous vehicles, simulating outputs of the perception/prediction system(s) 170A/170B, evaluating a performance associated with the motion planning system 170C of the vehicle computing system 110, etc.

As an example, the operations computing system 190A can obtain simplified scenario data (e.g., via network(s) 120, etc.) that describes a scenario. A machine-learned perception-prediction simulation model can be utilized (e.g., by the operations computing system 190A, etc.) to determine a simulated perception-prediction output (e.g., simulated perception data, simulated prediction data, etc.) based at least in part on the simplified scenario data.

The simulated perception-prediction output can be provided to the motion planning system 170C of the vehicle computing system 110 (e.g., via the one or more network(s) 120, etc.). The motion planning system 170C can be a system configured to generate motion plan data 175C based at least in part on the simulated perception-prediction output. As an example, if the simulated perception-prediction output indicates an obstruction in front of the autonomous vehicle 105 (e.g., a stopped vehicle, a minor collision, etc.), the motion plan data 175C can describe a series of movements over time that, when implemented by the vehicle 105 (e.g., via vehicle control system 150), are configured to avoid the obstruction.

In response to providing the simulated perception-prediction output to the motion planning system 170C of the vehicle computing system 110, the operations computing system 190A can obtain the motion plan data 175C from the motion planning system 170C of the vehicle computing system 110. In some implementations, the operations computing system 190A can determine a performance metric (e.g., safety, efficiency, etc.) associated with the motion plan data 175C. As an example, the simulated perception-prediction output can indicate an obstruction in front of the vehicle 105. The motion plan data 175C can describe a series of movements over time that, when implemented by the vehicle 105, are configured to avoid the obstruction. The operations computing system 190A can then determine a safety metric that evaluates a level of performance associated with the series of movements described by the motion plan data 175C (e.g., a level of safety, a level of efficiency, etc.). The performance metric can be determined by the operations computing system 190A in a variety of ways. As an example, the performance metric can be determined using one or more simulation techniques (e.g., machine-learned simulation model(s), etc.). As another example, the performance metric can be determined by implementing the motion plan output via the autonomous vehicle (e.g., in a simulated environment, etc.).

In some implementations, the motion planning system 170C of the vehicle computing system 110 can include one or more machine-learned motion planning models. The operations computing system 190A can evaluate a loss function that evaluates a difference between the motion plan data 175C of the vehicle computing system 110 and a ground truth label. The ground truth label can be or otherwise describe optimal motion plan data 175C for the vehicle 105 based on the simulated perception-prediction output. In some implementations, based at least in part on the loss function, the operations computing system 190A can determine one or more parameter adjustments for at least one of the one or more machine-learned motion planning models. The one or more parameter adjustments can be provided to the motion planning system 170C of the vehicle computing system 110 (e.g., via the one or more network(s) 120, etc.). The vehicle computing system 110 of the vehicle 105 can implement the one or more parameter adjustments to further optimize the motion planning system 170C of the vehicle computing system 110. In such fashion, the simulated perception-prediction output can be utilized to test and optimize the motion planning system 170C of the vehicle computing system 110, further increasing the safety and efficiency of the vehicle 105 in driving scenarios (e.g., autonomous driving scenarios, semi-autonomous driving scenarios, manual driving scenarios, etc.).

A user 125 can request a vehicle service from a service entity 185. For example, the user 125 can provide user input to a user device 130 to request a vehicle service (e.g., via a user interface associated with a mobile software application of the service entity 185 running on the user device 130). The user device 130 can communicate data indicative of a vehicle service request 195 to the operations computing system 190A associated with the service entity 185 (and/or another associated computing system that can then communicate data to the operations computing system 190A). The vehicle service request 195 can be associated with a user. The associated user can be the one that submits the vehicle service request (e.g., via an application on the user device 130). In some implementations, the user may not be the user that submits the vehicle service request. The vehicle service request can be indicative of the user. For example, the vehicle service request can include an identifier associated with the user and/or the user's profile/account with the service entity 185. The vehicle service request 195 can be generated in a manner that avoids the use of personally identifiable information and/or allows the user to control the types of information included in the vehicle service request 195. The vehicle service request 195 can also be generated, communicated, stored, etc. in a secure manner to protect information.

The vehicle service request 195 can indicate various types of information. For example, the vehicle service request 194 can indicate the type of vehicle service that is desired (e.g., a transportation service, a delivery service, a courier service, etc.), one or more locations (e.g., an origin location, a destination location, etc.), timing constraints (e.g., pick-up time, drop-off time, deadlines, etc.), and/or geographic constraints (e.g., to stay within a certain area, etc.). The service request 195 can indicate a type/size/class of vehicle such as, for example, a sedan, an SUV, luxury vehicle, standard vehicle, etc. The service request 195 can indicate a product of the service entity 185. For example, the service request 195 can indicate that the user is requesting a transportation pool product by which the user would potentially share the vehicle (and costs) with other users/items. In some implementations, the service request 195 can explicitly request for the vehicle service to be provided by an autonomous vehicle or a human-driven vehicle. In some implementations, the service request 195 can indicate a number of users that will be riding in the vehicle/utilizing the vehicle service. In some implementations, the service request 195 can indicate preferences/special accommodations of an associated user (e.g., music preferences, climate preferences, wheelchair accessibility, etc.) and/or other information.

The operations computing system 190A of the service entity 185 can process the data indicative of the vehicle service request 195 and generate a vehicle service assignment that is associated with the vehicle service request. The operations computing system can identify one or more vehicles that may be able to perform the requested vehicle services to the user 195. The operations computing system 190A can identify which modes of transportation are available to a user for the requested vehicle service (e.g., light electric vehicles, human-drive vehicles, autonomous vehicles, aerial vehicle, etc.) and/or the number of transportation modes/legs of a potential itinerary of the user for completing the vehicle service (e.g., single or plurality of modes, single or plurality of legs, etc.). For example, the operations computing system 190A can determined which autonomous vehicle(s) are online with the service entity 185 (e.g., available for a vehicle service assignment, addressing a vehicle service assignment, etc.) to help identify which autonomous vehicle(s) would be able to provide the vehicle service.

The operations computing system 190A and/or the vehicle computing system 110 can communicate with one or more other computing systems 190B that are remote from the vehicle 105. This can include, for example, computing systems associated with government functions (e.g., emergency services, regulatory bodies, etc.), computing systems associated with vehicle providers other than the service entity, computing systems of other vehicles (e.g., other autonomous vehicles, aerial vehicles, etc.). Communication with the other computing systems 190B can occur via the network(s) 120.

Figure 2:
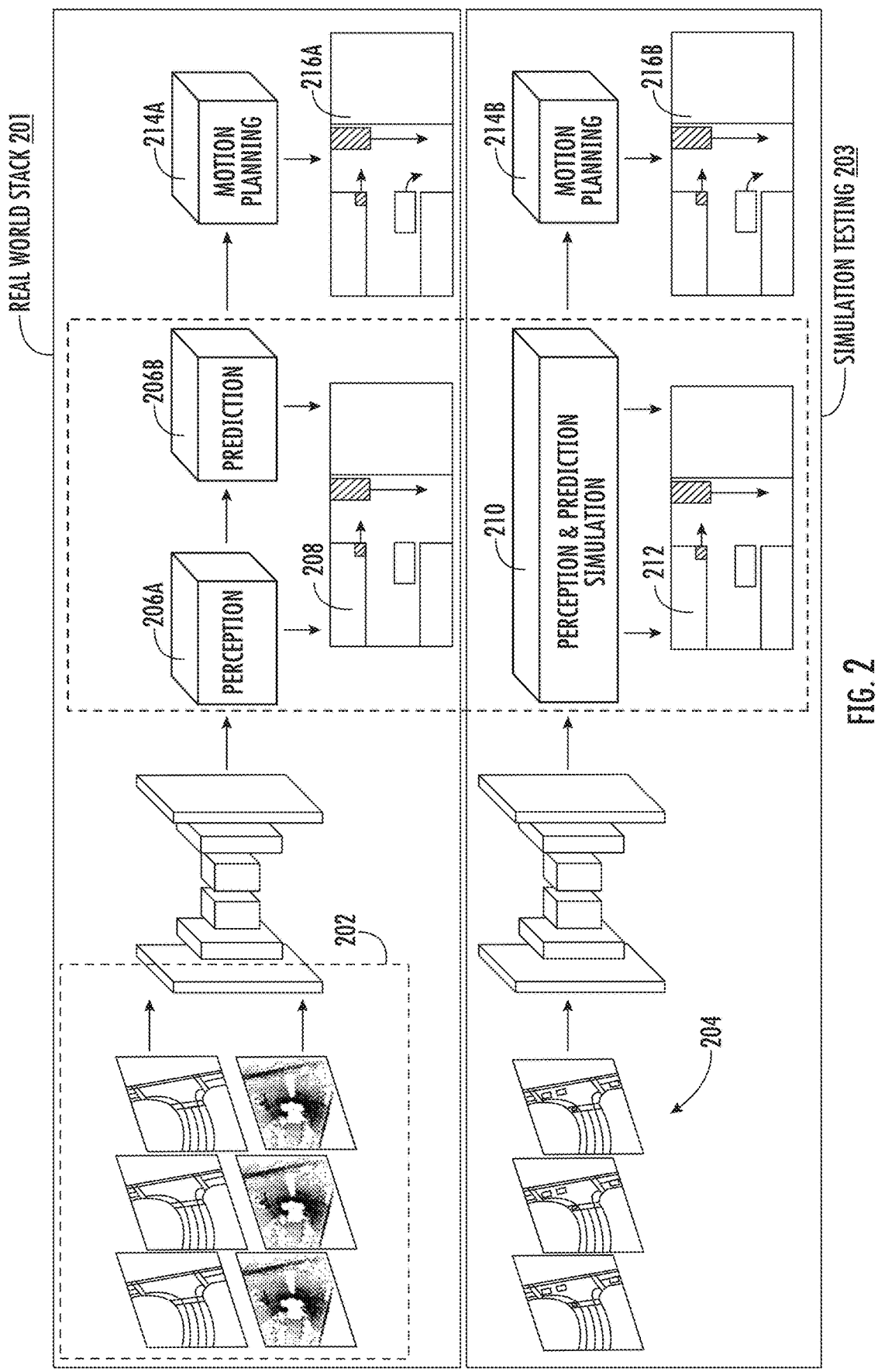
FIG. 2 depicts a data flow diagram for testing autonomous vehicle systems using simplified scenario data according to example embodiments of the present disclosure.

FIG. 2 depicts a data flow diagram 200 for testing autonomous vehicle systems using simplified scenario data according to example embodiments of the present disclosure. As an example, real world stack 201 depicts an example "real-world" processing scenario of sensor data 202 by autonomous vehicle systems (e.g., perception system 206A, prediction system 206B, motion planning system 214A, etc.). Perception system 206A, prediction system 206B, and/or motion planning system 214A can be configured to perform functions similar to those described with respect to FIG. 1. Conversely, simulation testing 203 depicts a simulated processing scenario of simplified scenario data 204 with a machine-learned perception-prediction simulation model 210.

More particularly, under a real-world stack 201 processing scenario, sensor data 202 (e.g., LIDAR data, image data, HTD mapping data, etc.) can be obtained (e.g., from one or more system(s) of an autonomous vehicle) that describes a driving scenario for an autonomous vehicle. As an example, the sensor data 202 may include high-definition mapping data for an area of a transportation network (e.g., an intersection, etc.), and additional data (e.g., LIDAR data, image data, etc.) configured to identify any entity(s) included in the area identified by the high-definition mapping data.

The sensor data 202 can be processed using the perception system 206A and the prediction system 206B. The perception system 206A and prediction system 206B can be systems of a vehicle computing system of an autonomous vehicle (e.g., systems 170A and 170B of vehicle computing system 110 of FIG. 1.). In some implementations, the perception system 206A and prediction system 206B can be discrete systems that process the sensor data 202 sequentially. Alternatively, in some implementations, the perception system 206A and prediction system 206B can be a joint perception-prediction system that is configured to process the sensor data 202 jointly. After processing the sensor data 202, the perception system 206A and the prediction system 206B can output perception-prediction data 208, which can be or otherwise include a perception output and a prediction output.

The perception-prediction data 208 can be provided to the motion planning system 214A. The motion planning system 214A can be a motion planning system of a vehicle computing system (e.g., system 170A and 170C of vehicle computing system 110 of FIG. 1.). The motion planning system 214A can process the perception-prediction data 208 to obtain motion planning data 216A. The motion planning data 216A can describe one or more motions configured to navigate the vehicle through a driving scenario indicated by the perception-prediction data 208 and the sensor data 202.

Conversely, under a simulation testing scenario 203, simplified scenario data 204 can be obtained. The simplified scenario data 204 can be associated with or otherwise represent the vehicle driving scenario associated with sensor data 202. In some implementations, the simplified scenario can be or otherwise include an intermediate output associated with the scenario described by the sensor data 202. As an example, the perception and prediction systems 206A/206B can generally receive sensor data 202 (e.g., LIDAR sensors, ultrasonic sensors, image sensors, etc.) and first generate intermediate outputs that represent or otherwise describe the environment and any actors about the vehicle (e.g., objects, transportation network segments, weather, etc.). The simplified scenario data 204 can represent an intermediate output of the perception and prediction systems 206A/206B of the autonomous vehicle.

As an example, the simplified scenario data 204 can be or otherwise include a traffic scenario W, which can include high-definition mapping data M, a set of actor and/or object representations located within the area of the transportation network A (e.g., an object class label and an associated bounding box, etc.), and metadata that describes the autonomous vehicle's starting state and desired route. It should be noted that the high-definition mapping data included in the simplified scenario data 204 can be the same or substantially similar to the high-definition mapping data included in the sensor data 202. In some implementations, the high-definition mapping data M of the simplified scenario data 204 can include semantic information regarding the transportation network traversed by the autonomous vehicle (e.g., lane boundaries, drivable surfaces, intersections, traffic lights, signs, etc.). Each actor $a_t \in A$ can be represented by a class label and a sequence of bounding boxes $b_i = \{b_{i,t}\}_{t=0}^{T}$, where T can represent the number of timesteps over a scenario's duration. In such fashion, one can view the simplified scenario data 204, W as a sequence of frames $\{W_t\}_{t=0}^{T}$, where the i-th actor in each frame $W_t$ can be represented in the output parameterization of a perception and prediction system such as systems 206A/206B (e.g., a class label $c_i$, a bounding box $b_i$, a set of future states $\{\hat{s}_{i,t=\delta}\}\delta=1^H$ etc.).

It should be noted that by representing the scenario using intermediate representations of objects and other data, the simplified scenario data 204 can be easily generated and utilized. As an example, the bounding boxes $b_i = \{b_{i,t}\}_{t=0}^{T}$ of the simplified scenario data 204 can be quickly and accurately sketched by a user (e.g., providing user input to a computing device via a input device such as a mouse, stylus, touch screen, etc.). As another example, a user (e.g., test engineer, etc.) can generate class label $c_i$ for bounding boxes $b_i$ in a matter of minutes (e.g., depending on the relative complexity of the scenario, the duration of the scenario, etc.). As yet another example, a user could sketch a trajectory for an object identified by a bounding box $b_i$ to indicate movement of the object over a plurality of future time steps T. In such fashion, simplified scenario data 204 provides for an accurate and efficient platform for creation of varied autonomous driving scenarios without the need for sensor data collection or simulation.

The simplified scenario data 204 can be processed using a machine-learned perception-prediction simulation model 210 (e.g., a perception and prediction systems simulation) to obtain a simulated perception-prediction output 212. The simulated perception-prediction output 212 can include simulated perception data and simulated prediction data. As an example, the machine-learned perception-prediction simulation model 210 can first process the simplified scenario data 204 using a feature extraction portion of the model 210. For example, the machine-learned perception-prediction simulation model 210 can perform feature extraction hierarchically at various scales of input resolution (e.g., ¼, ⅛, ¹⁄₁₆, etc.). These variously scaled and extracted features can be upscaled to a particular resolution (e.g., ¼, ⅛, etc.) and fused using one or more residual connections of the machine-learned perception-prediction simulation model. After fusion, a birds-eye-view feature map $\mathcal{F}_{BEV}(W_t, M) = CNN_{BEV}(W_t, M)$ can be obtained.

With the determined birds-eye-view feature map $\mathcal{F}_{BEV}(W_t, M) = CNN_{BEV}(W_t, M)$, the feature map can be processed to determine the simulated perception-prediction output 212. In some implementations, the machine-learned perception-prediction simulation model 210 can include or otherwise utilize a dual-head perception-prediction architecture that includes a perception submodel and a prediction submodel. Using this architecture, the simulated perception data of the simulated perception-prediction output 212 can be determined using the perception submodel. Alternatively, in some implementation, the machine-learned perception-prediction simulation model 210 can include or otherwise utilize an architecture that determines simulated perception data and simulated prediction data jointly and simultaneously to determine the simulated perception-prediction output 212 (e.g., using an architecture other than a dual-head perception and prediction architecture, etc.).

In some implementations, the perception submodel (e.g., a convolutional neural network, one or more convolutional layer(s), etc.) of the machine-learned perception-prediction simulation model 210 can be used to determine the simulated perception data of the simulated perception-prediction output 212 based at least in part on the simplified scenario data 204. The simulated perception data can, in some implementations, include predicted bounding boxes for each class of a plurality of object classes at every birds-eye-view pixel in the extracted feature map $\mathcal{F}_{BEV}(W_t, M)$ (e.g., vehicle(s), pedestrian(s), animal(s), obstruction(s), etc.). More particularly, for each class of interest (e.g., object class(es), etc.), a bounding box $\tilde{b}_i$ and detection score di can be predicted at every birds-eye-view pixel i of the birds-eye-view feature map $\mathcal{F}_{BEV}(W_t, M)$. The predicted bounding box $\tilde{b}_i$ can be parameterized as $(\Delta x_i, \Delta y_i, \log w_i, \log h_i, \sin \theta_i, \cos \theta_i)$, where $\Delta x_i, \Delta y_i$ can represent the position offsets to the box center of the predicted bounding box $\tilde{b}_i$, and $(w_i, h_i)$ can represent the width and height of the bounding box, and $\theta_i$ can represent the heading angle of the bounding box. In some implementations, all predicted bounding boxes $\tilde{b}_i$ can be kept above a score threshold $\tau=0$, and non-maximum suppression can be applied to remove all duplicate bounding boxes to obtain the simulated perception data (e.g., a set of simulated bounding boxes $\beta_{sim}(W_t, M) = \{\tilde{b}_i\}_{i=1}^{N}$, etc.) from the perception submodel of the machine-learned perception-prediction simulation model 210.

Similarly, in some implementations, the prediction submodel (e.g., a multi-layer perceptron, etc.) of the machine-learned perception-prediction simulation model 210 can be utilized to determine the simulated prediction data of the simulated perception-prediction output 212 based at least in part on the simplified scenario data and the simulated perception data $\beta_{sim}(W_t, M)$. In some implementations, this simulated prediction data can include a simulated set of future states for each bounding box $\tilde{b}_1 \in \beta_{sim}(W_t, M)$ by determining one or more feature vectors respectively descriptive of the one or more simulated bounding boxes $\beta_{sim}(W_t,M)$.

As an example, for each bounding box of $\beta_{sim}(W_t,M)$, a feature vector $f_i$ can be respectively determined for the bounding box $\tilde{b}_i$ by bilinearly interpolating the extracted feature map $F_{BEV}(W_t,M)$ around the box center of the bounding box $\tilde{b}_i$. Based on the one or more feature vectors, the prediction submodel can be used to determine the simulated prediction data that includes one or more future state predictions for each of the one or more simulated bounding boxes. As an example, for each of the extracted feature vector(s), the prediction submodel (e.g., a multi-layer perceptron, a model including a multi-layer perceptron component, etc.) can simulate future states $\tilde{s}_i = MLP_{pred}(f_i)$, where $\tilde{s}_i \in \mathbb{R}^{T \times 2}$ can represent a set of 2D waypoints over a prediction horizon T.

The simulated perception-prediction output 212 can be provided to a motion planning system 214B of a vehicle computing system. In some implementations, the motion planning system 214B can be the motion planning system 214A utilized in the real world stack processing scenario 201. Alternatively, in some implementations, the motion planning system 214B can be a different and discrete motion planning system that is configured to operate identically or substantially similar to the motion planning system 214A (e.g., a simulated motion planning system, a second instance of the motion planning system 214A, a virtualized instance of the motion planning system 214A, etc.). The motion planning system 214B can process the simulated perception-prediction output 212 to obtain motion planning data 216B. As the simulated perception-prediction output 212 can be identical or substantially similar to the perception-prediction output 208 of the real world stack processing scenario 201, the motion planning data 216B can be evaluated to optimize the motion planning system(s) 214A/214B in the same manner as the motion planning data 216A. In such fashion, the machine-learned perception-prediction simulation model 210 can be utilized in conjunction with the simplified scenario data 204 in the simulation testing processing scenario 203 to optimize the safety and efficiency of the motion planning system 214B, without the computationally expensive and inefficient collection of sensor data 202 that is inherent to the real-world stack processing scenario 201.

Figure 3:
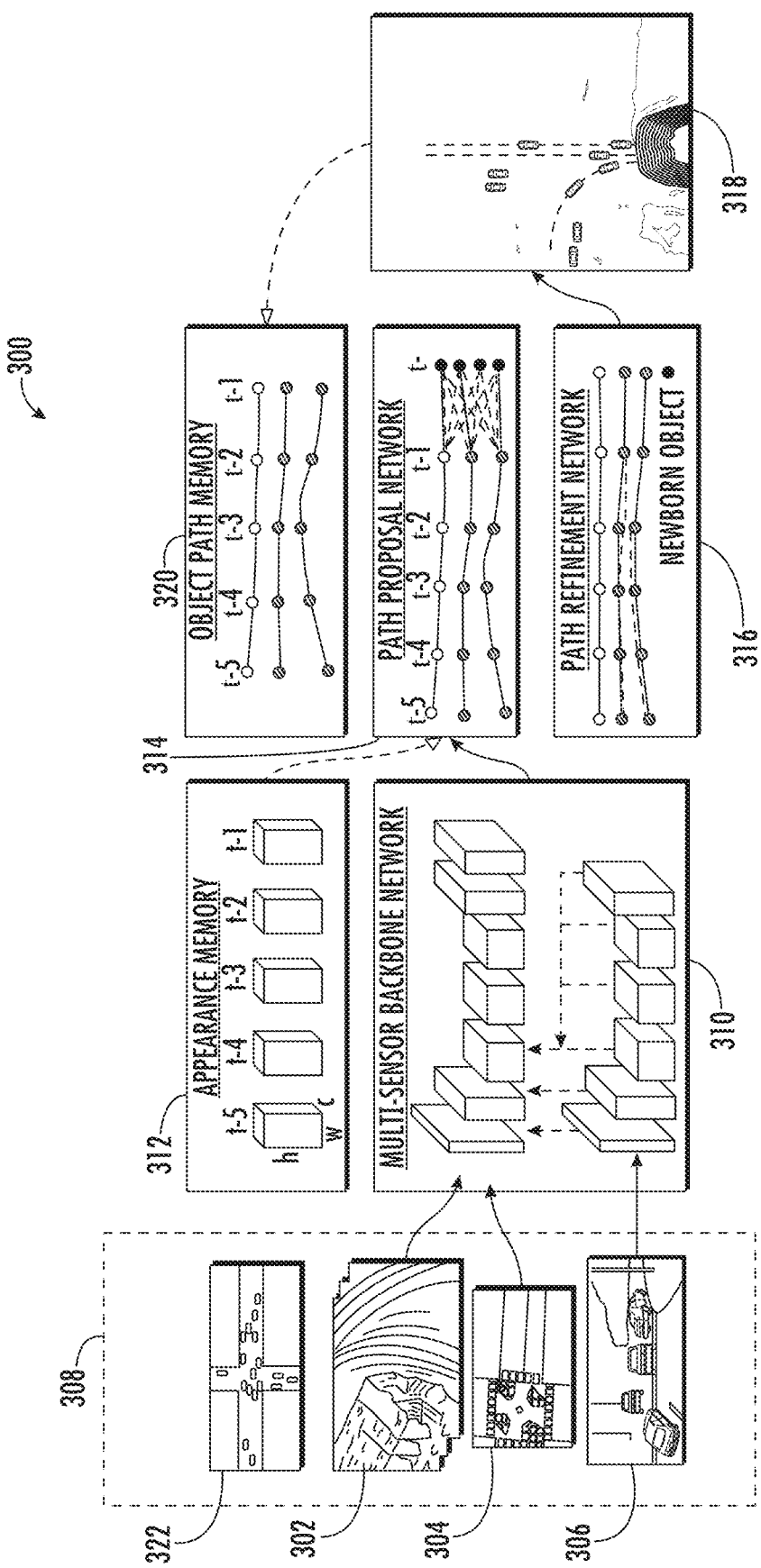
FIG. 3 depicts a model architecture of joint perception and prediction model(s) according to example implementations of the present disclosure.

FIG. 3 depicts a model architecture of joint perception and prediction model(s) according to example implementations of the present disclosure. The architecture 300 can represent an example architecture for a machine-learned perception and prediction model that is utilized by perception system 206A and prediction system 206B of FIG. 2. The joint perception and prediction model can include several memories and networks. For example, the architecture 300 can include a plurality of network branches (e.g., a branch for perception, a branch for prediction, etc.), a plurality of memories (e.g., an appearance memory, object path memory, etc.) as well as an object path proposal network and a path refinement network. FIG. 3 depicts input data 308 that can include an updated intermediate environment representation 322 (e.g., based on an aggregation of a plurality of intermediate environment representations from a plurality of systems). The input data 308 can also, or alternatively, include other sensor data such as, for example, LiDAR data 302, map data 304, and image data 306. The architecture 300 can include model(s) 310 (including the plurality of branches), an appearance memory 312, one or more path proposal models 314, one or more path refinement models 316, output data 318, and object path memory 320.

It should be noted that the simplified scenario data 204 of FIG. 2 can be or otherwise include an intermediate representation of the input data 308. As an example, the input data 308 can be processed by the machine-learned model(s) (or a portion of the model(s)) of the architecture 300 to obtain an intermediate representation of the input data 308. The simplified scenario data 204 can be or otherwise represent the intermediate representation of the input data 308. In such fashion, the simplified scenario data 204 can be utilized in a similar fashion as the input data 308 without the computationally expensive and inefficient collection of input data 308.

The LiDAR data 302 can include LiDAR point cloud data generated by one or more LiDAR devices that detect an environment around the one or more LiDAR devices. The LiDAR data 302 can include a three-dimensional representation of the environment. The three-dimensional representation of the environment can include a set of three-dimensional points (e.g., x, y, and z coordinates) that indicate the location of surfaces in the environment. For example, the LiDAR data 302 can include a three-dimensional representation of an environment including the locations of one or more objects in that environment (e.g., one or more objects including pedestrians, vehicles, roads, and/or buildings). Further, the LiDAR data 302 can be based at least in part on one or more LiDAR sweeps by one or more LiDAR devices mounted on a system (e.g., an autonomous vehicle) that traverses/is located within the environment.

The map data 304 can include information associated with the state of an environment (e.g., a geographic area) including the locations (e.g., latitude, longitude, and/or altitude) and/or dimensions (e.g., length, width, and/or height) of one or more objects and/or features of the environment. In some embodiments, the map data 304 can include a bird's eye representation of a geographic area. For example, the map data 304 can include a top-down representation of an environment that includes information associated with the relative location of features including roads, sidewalks, and/or buildings. Further, the map data 304 can be defined relative to an ego vehicle as the ego vehicle traverses the environment depicted by the map data 304. Based at least in part on ego motion information associated with the ego vehicle, the locations of one or more objects (e.g., locations of the one or more objects relative to the ego vehicle and/or a latitude and/or longitude associated with of the one or more objects) in the environment can be determined.

The image data 306 can include information associated with one or more images of an environment. The one or more images associated with the image data 306 can include various image formats including raster (e.g., bitmap), vector, and/or voxel image formats. Further, the one or more images can be two-dimensional images of an environment captured from an angle determined by the position of the respective image capture device (e.g., a camera). For example, the image data 306 can include one or more RGB images of an environment captured by a camera. Further, the image data 306 can be based at least in part on images captured by one or more cameras mounted on a system (e.g., an autonomous vehicle) that traverses/is located within the environment.

The one or more models 310 can include one or more machine-learned models (e.g., one or more recurrent neural networks, etc.) that are configured to: receive one or more inputs including one or more portions of the input data 308; perform one or more operations associated with the one or more inputs including extracting one or more motion features and/or one or more motion features from the one or more objects represented by the input data 308; and generate one or more outputs including a set of feature maps that can be stored in the appearance memory 312 and/or provided as an input to the path proposal model 314.

For example, the input data 308 can be provided as input to the one or more models 310, which store output(s) (one or more feature maps representing an environment associated with the input data 308 over a plurality of time intervals) in the appearance memory 312. The feature map(s) generated by the model(s) 310 can include appearance features and/or motion features of the one or more objects in the environment (e.g., vehicles, pedestrians, etc.) associated with the input data 308. Further, the one or more models 310 can generate a plurality of temporal instance representations associated with the appearance and/or motion of the one or more objects represented in the plurality of feature maps.

The appearance memory 312 can store information and/or data associated with the appearance of one or more objects that were previously detected and/or previously represented by the input data 308. For example, the appearance memory 312 can include a plurality of feature maps associated with a detected environment, in which each feature map includes information associated with the appearance of one or more objects at a time interval of a plurality of time intervals (e.g., sequential time intervals).

The object path memory 320 can store information and/or data associated with one or more paths (e.g., a set of locations at which an object was present at and corresponding time intervals in the past) corresponding to each of the one or more objects that were previously detected and/or previously represented by the input data 308. For example, the object path memory 320 can include feature map(s) associated with a detected environment, in which each feature map includes information associated with the geographic location (e.g., latitude, longitude, and/or altitude) of each of the one or more objects at a time interval of a plurality of time intervals (e.g., sequential time intervals).

The plurality of temporal instance representations generated as output by the one or more models 310 can be provided as an input to the one or more path proposal models 314 (e.g., one or more recurrent neural networks). The one or more path proposal models 314 can be configured and/or trained to generate (based on the plurality of temporal instance representations) output including one or more path proposals for the one or more objects associated with the plurality of temporal instance representations. The one or more path proposals can be based at least in part on optimizing matches between previous paths of the one or more objects and current detections of the one or more objects. The one or more path proposals can include one or more candidate paths for the one or more objects. When multiple candidate paths are associated with a single object, the multiple candidate paths can be merged and can include overlapping candidate paths, which can later be refined into a single path by the one or more path refinement models 316. In some embodiments, each of the one or more objects can be associated with more than one candidate paths, which can be refined by the one or more path refinement models 316 that can be configured and/or trained to generate one or more refined predicted paths that replace duplicate candidate paths.

The one or more path refinement models 316 (e.g., one or more recurrent neural networks) can be configured and/or trained to receive output including information and/or data associated with the one or more path proposals generated by the one or more path proposal models 314. Further, the one or more path refinement models 316 can be configured to perform one or more operations including generating one or more confidence scores associated with the one or more path proposals. The one or more confidence scores can be associated with accuracy of each of the one or more path proposals (e.g., a path proposal that is more accurate and/or more likely to be correct can have a greater score than a path proposal that is less accurate and/or less likely to be correct). In some embodiments, the one or more path refinement models 316 can generate one or more refined predicted paths corresponding to the one or more objects. The one or more refined predicted paths generated by the one or more path refinement models 316 can be based at least in part on refinement of a bounding shape associated with each of the one or more objects at each time interval associated with each respective object. The one or more refined predicted paths can then be ranked based at least in part on their respective confidence scores, with the highest ranking predicted paths being included in the output data 318.

The output data 318 can include information associated with the one or more predicted paths of the one or more objects. For example, the output data 318 can include one or more predicted locations (e.g., geographic locations including latitude, longitude, and/or altitude) of the one or more objects at one or more time intervals subsequent to the current time interval. The output data 318 can include information associated with one or more predicted trajectories of the one or more objects. In some embodiments, one or more portions of the output data 318 can be stored in the object path memory 320.

With reference again to FIG. 2, a motion planning system (e.g., motion planning system(s) 214A/214B, etc.) can generate a motion plan based at least in part on the output data 318. For example, the motion planning system(s) 214A/214B can determine a motion plan and generate motion plan data 216A/216B based at least in part on the output data 318 in that it can consider an object (and/or its future location(s)) described in the output data 318 when planning the motion of the vehicle, whether or not that is overridden by other factors (e.g., other objects, unexpected occurrences, etc.) or whether or not it eventually effects the actual motion of the vehicle. The motion plan data 216A/216B can include vehicle actions, trajectories, waypoints, etc. with respect to the objects proximate to the vehicle as well as the predicted movements. For example, the motion planning system(s) 214A/214B can include one or more machine-learned models/optimization algorithms that consider cost data associated with an action of the vehicle as well as other objective functions (e.g., cost functions, etc.), if any, to determine optimized variables that make up the motion plan data 216A/216B. By way of example, the motion planning system(s) 214A/214B can determine that the vehicle can perform a certain action (e.g., stop for a perceived object) without increasing the potential risk to the vehicle, violating any laws/rules, increasing risk to others, etc. The motion plan data 216A/216B can include a planned trajectory, velocity, acceleration, and/or other actions. For example, as illustrated in FIG. 2, the motion plan can include a trajectory for a vehicle through an area depicted by the sensor data 202.

Figure 4:
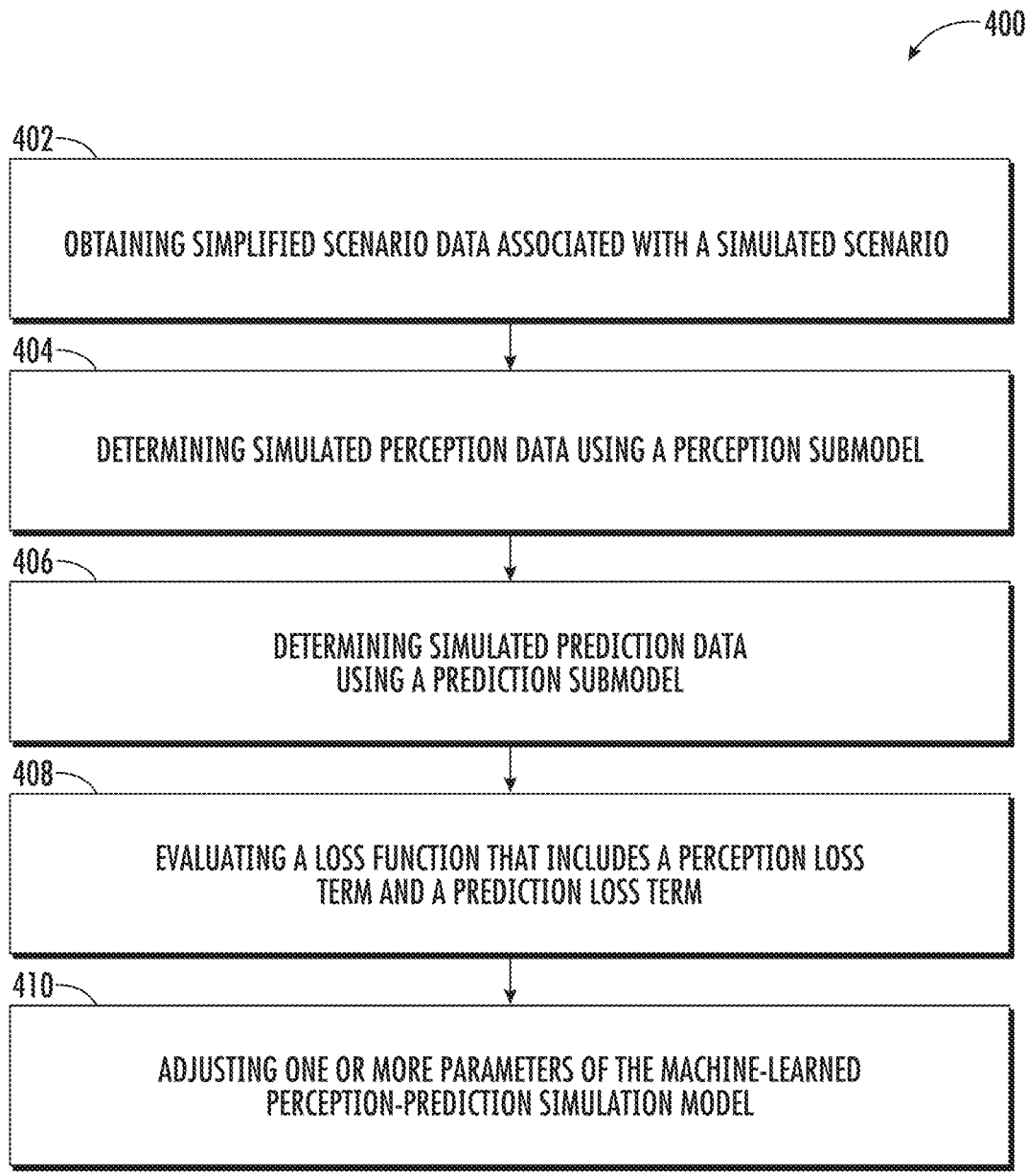
FIG. 4 depicts a flowchart of a method for training a machine-learned perception-prediction simulation model according to example implementations of the present disclosure.

FIG. 4 depicts a flowchart of a method 400 for training a machine-learned perception-prediction simulation model according to example implementations of the present disclosure. One or more portion(s) of the method 400 can be implemented by one or more computing devices such as, for example, the computing devices described in FIGS. 1, 2, 6, and 7. Moreover, one or more portion(s) of the method 400 can be implemented as an algorithm on the hardware components of the device(s) described herein (e.g., as in FIG. 1, 7, etc.) to, for example, train a machine-learned perception-prediction simulation model. FIG. 4 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, and/or modified in various ways without deviating from the scope of the present disclosure.

At (402), the method 400 can include obtaining simplified scenario data associated with a simulated scenario. For instance, a computing system (e.g., operations computing system 190A) can obtain simplified scenario data that is associated with or otherwise represents an autonomous vehicle driving scenario. In some implementations, the simplified scenario can be or otherwise include an intermediate output associated with a scenario for a perception and a prediction system of an autonomous vehicle. As an example, autonomous vehicle perception and prediction systems can generally receive sensor data (e.g., LIDAR sensors, ultrasonic sensors, image sensors, etc.) and generate intermediate outputs that represent or otherwise describe an environment and any actors about the autonomous vehicle (e.g., objects, transportation network segments, weather, etc.). The simplified scenario data can represent an intermediate output of the perception and prediction systems of the autonomous vehicle.

As an example, the simplified scenario data can be or otherwise include a traffic scenario W, which can include high-definition mapping data M, a set of actor and/or object representations located within the area of the transportation network A (e.g., an object class label and an associated bounding box, etc.), and metadata that describes the autonomous vehicle's starting state and desired route. In some implementations, the high-definition mapping data M can include semantic information regarding the transportation network traversed by the autonomous vehicle (e.g., lane boundaries, drivable surfaces, intersections, traffic lights, signs, etc.). Each actor $a_i \in A$ can be represented by a class label $c_i$ and a sequence of bounding boxes $b_i = \{b_{i,t}\}_{t=0}^T$, where T can represent the number of timesteps over a scenario's duration. In such fashion, one can view the simplified scenario data W as a sequence of frames $\{W_t\}_{t=0}^T$, where the i-th actor in each frame $W_t$ can be represented in the output parameterization of a perception and prediction system (e.g., a class label $c_i$, a bounding box $b_i$, a set of future states $\{\hat{s}_{i,t+\delta}\}_{s=1}^H$ etc.).

It should be noted that by representing the scenario using intermediate representations of objects and other data, the simplified scenario data can be easily generated and utilized. As an example, the bounding boxes $b_i = \{b_{i,t}\}_{t=0}^T$ of the simplified scenario data can be quickly and accurately sketched by a user. As another example, a user (e.g., test engineer, etc.) can generate class label $c_i$ for bounding boxes $b_i$ in a matter of minutes (e.g., depending on the relative complexity of the scenario, the duration of the scenario, etc.). As yet another example, a user could sketch a trajectory for an object identified by a bounding box $b_i$ to indicate movement of the object over a plurality of future time steps T. In such fashion, simplified scenario data provides for an accurate and efficient platform for creation of varied autonomous driving scenarios without the need for sensor data collection or simulation. A user can sketch a trajectory by providing user input to a computing device (e.g., laptop, desktop, tablet, etc.) via an input device (e.g., mouse, keyboard, touchscreen, stylus, touch pad, etc.). The computing device can obtain data indicative of the user input, process it, and render a graphical representation of the trajectory via a display device.

At (404), the method 400 can include determining simulated perception data using a perception submodel. For instance, a computing system (e.g., operations computing system 190A) can, based at least in part on the simplified simulation data, determine a simulated perception-prediction output using a machine-learned perception-prediction simulation model. The simulated perception-prediction output can include simulated perception data (e.g., a simulated perception output of an autonomous vehicle perception system) and simulated prediction data (e.g., a simulated prediction output of an autonomous vehicle prediction system). More particularly, the machine-learned perception-prediction simulation model can be configured to simulate the perception and prediction systems of the autonomous vehicle, and can be utilized to process a particular frame $W_t$ of the simplified scenario data that includes birds-eye-view raster images of the environment about the autonomous vehicle (e.g., from an ego-centric perspective of the autonomous vehicle, etc.). As an example, for each class of interest (e.g., persons, vehicles, etc.) actors associated with each class can be rendered in a temporal sequence of occupancy masks.

In some implementations, this rasterization can be performed for time periods occurring previously to the particular frame $W_t$ and for time periods occurring subsequently to the particular frame. For example, the occupancy masks can be rendered 0.5 seconds into the previously and 3.0 seconds subsequently. Additionally, or alternatively, in some implementations the high-definition mapping data can be rasterized into multiple binary images and processed alongside the birds-eye-view raster images using the machine-learned perception-prediction simulation model. As an example, the lane boundaries of a transportation network can be rasterized (e.g., as polylines, etc.), and drivable surfaces and intersections can be represented as filled polygons from a birds-eye-view of the environment.

It should be noted that generally, occlusion can act as a source of systemic errors for conventional autonomous vehicle perception and prediction systems. As an example, a heavily occluded pedestrian (e.g., from the perspective of the autonomous vehicle, etc.) is generally more likely to be mis-detected by these systems. However, conventionally simulated sensor data fails to account for the errors associated with occlusion. As such, by representing occlusion, systems and methods of the present disclosure can also simulate the errors associated with occlusion, therefore facilitating accurate testing and simulation of autonomous vehicle systems.

To represent occlusion within the simplified scenario data, a temporal sequence of two-dimensional occlusion masks can, in some implementations, be rendered and included in the simplified scenario data. As an example, prior to determining a simulated perception-prediction output, a constant-horizon ray-casting algorithm can be utilized to determine one or more occlusion masks based at least in part on the location of at least the autonomous vehicle within the area of the transportation network (e.g., a temporal sequence of 2D occlusion masks for 0.5 seconds into the "past"). In some implementations, these one or more occlusion masks can be included in the simplified scenario data.

Using the machine-learned perception-prediction simulation model, a simulated perception-prediction output can be determined that includes simulated perception data and simulated prediction data. As an example, the machine-learned perception-prediction simulation model can first process the simplified scenario using a feature extraction portion of the model. For example, the machine-learned perception-prediction simulation model can perform feature extraction hierarchically at various scales of input resolution (e.g., ¼, ⅛, 1/16, etc.). These variously scaled and extracted features can be upscaled to a particular resolution (e.g., ¼, ⅛, etc.) and fused using one or more residual connections of the machine-learned perception-prediction simulation model. After fusion, a birds-eye-view feature map $\mathcal{F}_{BEV}(W_P,M) = CNN_{BEV}(W_P,M)$ can be obtained.

With the determined birds-eye-view feature map $\mathcal{F}_{BEV}(W_P,M) = CNN_{BEV}(W_P,M)$, the feature map can be processed to determine the simulated perception-prediction output. In some implementations, the machine-learned perception-prediction simulation model can include or otherwise utilize a dual-head perception-prediction architecture that includes a perception submodel and a prediction submodel. Using this architecture, the simulated perception data of the simulated perception-prediction output can be determined using the perception submodel, and the simulated prediction data of the simulated perception-prediction output can be determined using the prediction submodel. Alternatively, in some implementation, the machine-learned perception-prediction simulation model can include or otherwise utilize an architecture that determines simulated perception data and simulated prediction data jointly and simultaneously to determine the simulated perception-prediction output (e.g., using an architecture other than a dual-head perception and prediction architecture, etc.).

At (406), the method 400 can include determining simulated prediction data using a prediction submodel. For instance, a computing system (e.g., operations computing system 190A) can utilize the perception submodel (e.g., a convolutional neural network, one or more convolutional layer(s), etc.) of the machine-learned perception-prediction simulation model to determine the simulated perception data of the simulated perception-prediction output based at least in part on the simplified scenario data. The simulated perception data can, in some implementations, include predicted bounding boxes for each class of a plurality of object classes at every birds-eye-view pixel in the extracted feature map $\mathcal{F}_{BEV}(W_P,M)$ (e.g., vehicle(s), pedestrian(s), animal(s), obstruction(s), etc.). More particularly, for each class of interest (e.g., object class(es), etc.), a bounding box $\tilde{b}_i$ and detection score $\tilde{a}_i$ can be predicted at every birds-eye-view pixel i of the birds-eye-view feature map $\mathcal{F}_{BEV}(W_P,M)$. The predicted bounding box $\tilde{b}_i$ can be parameterized as $(\Delta x_i, \Delta y_i, \log w_i, \log h_i, \sin \theta_i, \cos \theta_i)$, where $\Delta x_i, \Delta y_i$ can represent the position offsets to the box center of the predicted bounding box $\tilde{b}_i$. $(w_i, h_i)$ can represent the width and height of the bounding box, and $\theta_i$ can represent the heading angle of the bounding box. In some implementations, all predicted bounding boxes $\tilde{b}_i$ can be kept above a score threshold $\tau=0$, and non-maximum suppression can be applied to remove all duplicate bounding boxes to obtain the simulated perception data (e.g., a set of simulated bounding boxes $\beta_{sim}(W_P,M) = \{\tilde{b}_i\}_{i=1}^N$, etc.) from the perception submodel of the machine-learned perception-prediction simulation model.

Similarly, in some implementations, the prediction submodel (e.g., a multi-layer perceptron, etc.) can be utilized to determine the simulated prediction data of the simulated perception-prediction output based at least in part on the simplified scenario data and the simulated perception data $\beta_{sim}(W_P,M)$. In some implementations, this simulated prediction data can include a simulated set of future states for each bounding box $\tilde{b}_i \in \beta_{sim}(W_P,M)$ by determining one or more feature vectors respectively descriptive of the one or more simulated bounding boxes $\beta_{sim}(W_P,M)$.

As an example, for each bounding box of $\beta_{sim}(W_P,M)$, a feature vector $f_i$ can be respectively determined for the bounding box $\tilde{b}_i$ by bilinearly interpolating the extracted feature map $\mathcal{F}_{BEV}(W_P,M)$ around the box center of the bounding box $\tilde{b}_i$. Based on the one or more feature vectors, the prediction submodel can be used to determine the simulated prediction data that includes one or more future state predictions for each of the one or more simulated bounding boxes. As an example, for each of the extracted feature vector(s), the prediction submodel (e.g., a multi-layer perceptron, a model including a multi-layer perceptron component, etc.) can simulate future states $\tilde{s}_i = MLP_{pred}(f_i)$, where $\tilde{s}_i \in \mathbb{R}^{T \times 2}$ can represent a set of 2D waypoints over a prediction horizon T.

In some implementations, the future state prediction(s) for bounding boxes can be based at least in part on previous future state predictions. As an example, the one or more simulated bounding boxes $\beta_{sim}(W_P,M)$ can be or otherwise include a plurality of simulated bounding boxes. A future state prediction for a first simulated bounding box $\tilde{b}_1$ can be based at least in part on a future state prediction for a second simulated bounding box $\tilde{b}_2$. By simulating the future states $\tilde{s}_i$, a set of future states $S_{sim}(W_P,M) = \{\tilde{s}_i\}_{i=1}^N$ can be determined. In such fashion, the final simulated perception-prediction output can be or otherwise include the combination of the simulated prediction data $S_{sim}(W_P,M)$ and the simulated perception data $\beta_{sim}(W_P,M)$.

As described previously, it should be noted that the dense output parameterization of the feature map $\mathcal{F}_{BEV}(W_P,M)$ allows for the handling and simulation of false positive and/or false negative misdetections that are inherent to conventional perception and prediction systems. As an example, a perception output of a conventional perception system can include one or more falsely detected bounding boxes (e.g., a false positive bounding box, a false negative bounding box, etc.). Similarly, based on the dense output parameterization, at least one of the one or more simulated bounding boxes $\beta_{sim}(W_P,M)$ of the simulated perception data can include one or more simulated falsely detected bounding box(es) (e.g., a simulated false positive bounding box, etc.). In such fashion, the simulated bounding boxes, and therefore the simulated perception-prediction output, can accurately model the errors (e.g., false detection of bounding boxes, etc.) inherent to conventional perception-prediction systems.

At (408), the method 400 can include evaluating a loss function that includes a perception loss term and a prediction loss term. For instance, a computing system (e.g., operations computing system 190A) can evaluate a loss function that includes a perception loss term and a prediction loss term. The perception loss term can evaluate a difference between the simulated perception data and ground truth perception data. Similarly, the prediction loss term can evaluate a difference between the simulated prediction data and ground truth prediction data. In some implementations, the ground truth perception data can include a perception output of a perception system of an autonomous vehicle, and the ground truth prediction data can include a prediction output of a prediction system of an autonomous vehicle. The perception output and prediction output can be based at least in part on sensor data associated with the simulated scenario. As an example, the simplified scenario data can represent a simulated scenario for which sensor data is already available (e.g., collected real-time sensor data, simulated sensor data, etc.). The sensor data can be provided to a perception and prediction system of an autonomous vehicle, and in response, the perception output and the prediction output of the ground truth data can be obtained. As such, the loss function can evaluate the difference between the outputs of the simulated perception-prediction system (e.g., the machine-learned perception-prediction simulation model) and a conventionally implemented perception-prediction system of an autonomous vehicle. In such fashion, the loss function can be utilized to distill the knowledge of the perception and prediction systems of the autonomous vehicle to the machine-learned perception-prediction simulation model.

More particularly, as an example, the loss function can be or otherwise include a multi-task loss function $L(\varphi)=l_{perc}(\varphi)+l_{pred}(\varphi)$, where $l_{perc}(\varphi)$ can represent the perception loss term and $l_{pred}(\varphi)$ can represent the prediction loss term. In some implementations, the perception loss term can be or otherwise include a standard multi-task detection loss. For object classification, a binary cross-entropy can be utilized with online negative hard-mining, where positive and negative birds-eye-view pixels are determined according to their distances to an object's center. In some implementations, with box regression a smooth $l_1$ loss can be utilized for box orientation, and an axis-aligned intersection-over-union (IoU) loss can be utilized for predicted box locations and sizes.

In some implementations, the prediction loss term can evaluate a sum of smooth $l_1$ losses over future way points for each positive sample. As an example, a sample can be determined to be positive if the intersection-over-union (IoU) of the sample with a ground truth box exceeds a certain threshold (e.g., a threshold of 0.5 for vehicles, a threshold of 0.3 for bicyclists and/or pedestrians, etc.).

At (410), the method 400 can include adjusting one or more parameters of the machine-learned perception-prediction simulation model. For instance, a computing system (e.g., operations computing system 190A) can adjust one or more parameters of the machine-learned perception-prediction simulation model based at least in part on the loss function. More particularly, the differences evaluated by the perception loss term and the prediction loss term can be backpropagated through the machine-learned perception-prediction simulation model to determine values associated with one or more parameters of the machine-learned perception-prediction simulation model to be updated. The one or more parameters can be updated to reduce the difference evaluated by the loss function (e.g., using a gradient descent algorithm). In such fashion, the model(s) can be trained to simulate the outputs of perception, prediction, and/or perception-prediction system(s) of an autonomous vehicle through knowledge distillation.

Figure 5:
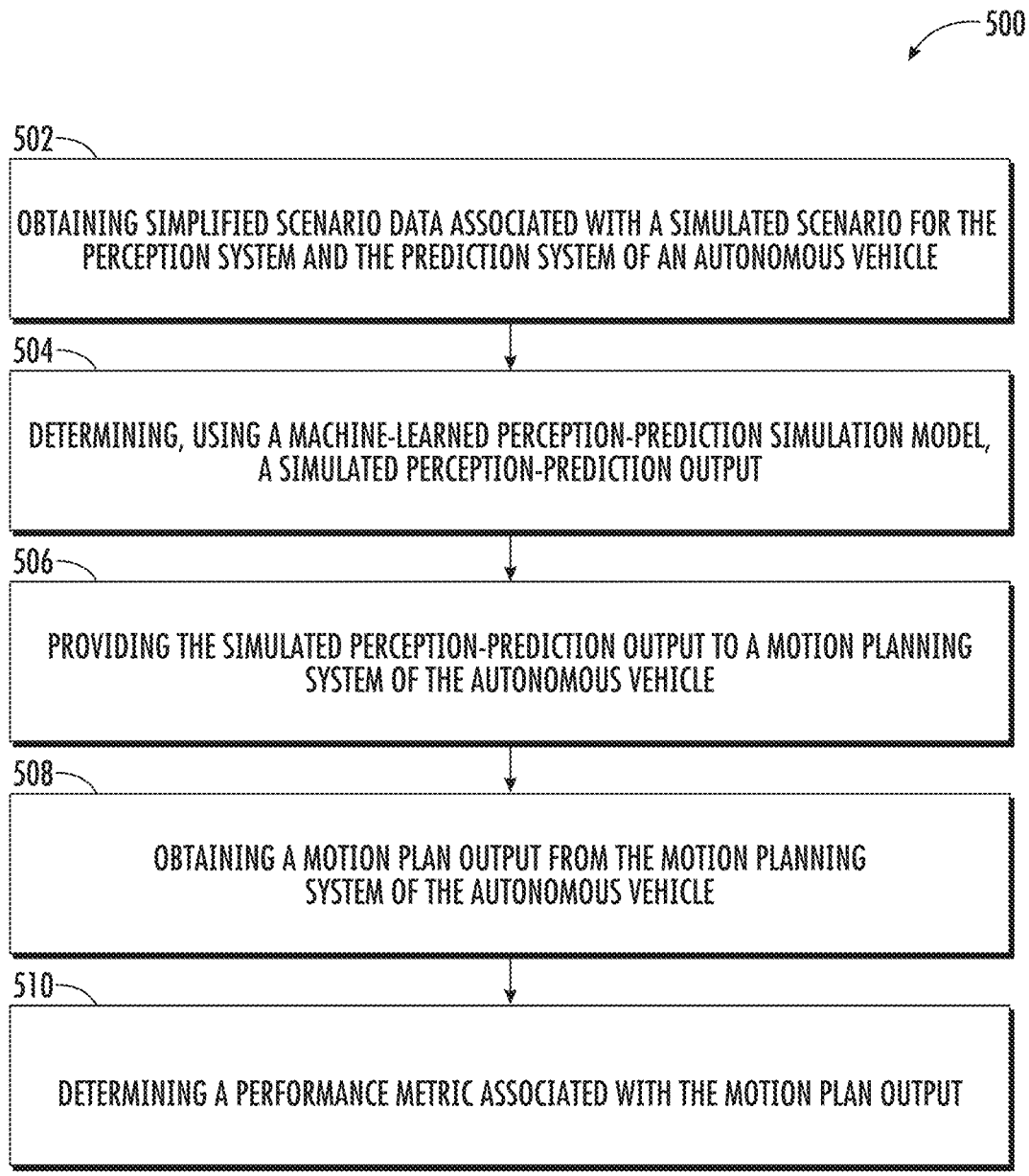
FIG. 5 depicts a flowchart of a method for testing an autonomous vehicle motion planning system according to aspects of the present disclosure.

FIG. 5 depicts a flowchart of a method 500 for testing an autonomous vehicle motion planning system according to aspects of the present disclosure. One or more portion(s) of the method 500 can be implemented by one or more computing devices such as, for example, the computing devices described in FIGS. 1, 6, and 7. Moreover, one or more portion(s) of the method 500 can be implemented as an algorithm on the hardware components of the device(s) described herein (e.g., as in FIGS. 1, 6, and 7) to, for example, test an autonomous vehicle motion planning system. FIG. 5 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, and/or modified in various ways without deviating from the scope of the present disclosure.

At (502), the method 500 can include obtaining simplified scenario data associated with a simulated scenario for the perception system and the prediction system of an autonomous vehicle. For instance, a computing system (e.g., operations computing system 190A)) can utilize machine-learned perception-prediction simulation model (once trained) to simulate a perception system and a prediction system of an autonomous vehicle. More particularly, perception and prediction outputs simulated by the machine-learned perception-prediction simulation model can be utilized to test the safety and efficiency of various autonomous vehicle systems (e.g., autonomous vehicle motion planning system(s), etc.).

As an example, a computing system (e.g., an autonomous vehicle computing system, an operations computing system of a service entity, etc.) can obtain simplified scenario data (e.g., additional simplified scenario data, etc.) that describes a scenario (e.g., an additional scenario different than the previously described scenario). The simplified scenario data can be obtained in the same or a substantially similar manner as described in step 402 of FIG. 4.

At (504), the method 500 can include determining, using a machine-learned perception-prediction simulation model, a simulated perception-prediction output. For instance, a computing system (e.g., operations computing system 190A)) can utilize a trained machine-learned perception-prediction simulation model to determine a simulated perception-prediction output. The simulated perception-prediction output (e.g., perception data, prediction data, etc.) can be determined as described in steps 404 and 406 of FIG. 4.

At (506), the method 500 can include providing the simulated perception-prediction output to a motion planning system of the autonomous vehicle. For instance, a computing system (e.g., operations computing system 190A)) can provide the simulated perception-prediction output to a motion planning system of an autonomous vehicle (e.g., via one or more network(s), etc.). The motion planning system can be a system configured to generate a motion plan output based at least in part on the simulated perception-prediction output. As an example, if the simulated perception-prediction output indicates an obstruction in front of the autonomous vehicle (e.g., a stopped vehicle, a minor collision, etc.), the motion plan can describe a series of movements over time that, when implemented by the vehicle, are configured to avoid the obstruction.

At (508), the method 500 can include obtaining a motion plan output from the motion planning system of the autonomous vehicle. For instance, a computing system (e.g., operations computing system 190A)) can, in response to providing the simulated perception-prediction output to the motion planning system of the autonomous vehicle, obtain a motion plan output from the motion planning system of the autonomous vehicle. In some implementations, the computing system can determine a performance metric (e.g., safety, efficiency, etc.) associated with the motion plan output. As an example, the simulated perception-prediction output can indicate an obstruction in front of the autonomous vehicle. The motion plan can describe a series of movements over time that, when implemented by the vehicle, are configured to avoid the obstruction.

At (510), the method 500 can include determining a performance metric associated with the motion plan output. For instance, a computing system (e.g., operations computing system 190A)) can determine a safety metric that evaluates a level of performance associated with the series of movements described by the motion plan (e.g., a level of safety, a level of efficiency, etc.). The performance metric can be determined by the computing system in a variety of ways. As an example, the performance metric can be determined using one or more simulation techniques (e.g., machine-learned simulation model(s), etc.). As another example, the performance metric can be determined by implementing the motion plan output via the autonomous vehicle (e.g., in a simulated environment, etc.).

In some implementations, the performance metric can be utilized to optimize system(s) of the autonomous vehicle. As an example, a motion planning system can output motion planning data. The performance metric can indicate a performance of the motion plan described by the motion planning data (e.g., a safety of the plan, an efficacy of the plan, etc.). Based on the metric, the motion planning system can be adjusted to optimize the performance of the systems. For example, the motion planning system can include one or more machine-learned models configured to generate motion planning data (e.g., and/or facilitate generation of motion planning data). The performance metric and/or the motion planning data can be evaluated using a loss function. Based on the loss function, one or more parameters of the machine-learned model(s) can be adjusted to optimize the performance of the motion planning system. In such fashion, the simplified scenario data, alongside the machine-learned perception-prediction simulation model, can be utilized to quickly and efficiently optimize the motion planning system and/or any machine-learned model(s) utilized by the motion planning system.

In some implementations, the motion planning system of the autonomous vehicle can include one or more machine-learned motion planning models. The computing system can evaluate a loss function that evaluates a difference between the motion plan output of the autonomous vehicle and a ground truth label. The ground truth label can be or otherwise describe an optimal motion plan for the autonomous vehicle based on the simulated perception-prediction output. In some implementations, based at least in part on the loss function, the computing system can determine one or more parameter adjustments for at least one of the one or more machine-learned motion planning models. The one or more parameter adjustments can be provided to the motion planning system of the autonomous vehicle (e.g., via one or more network(s), etc.). The computing system of the autonomous vehicle can implement the one or more parameter adjustments to further optimize the motion planning system of the autonomous vehicle. In such fashion, the simulated perception-prediction output can be utilized to test and optimize a motion planning system of an autonomous vehicle, further increasing the safety and efficiency of the autonomous vehicle in autonomous driving scenarios.

In some implementations, the computing system can be or otherwise include a service entity computing system associated with a service entity that facilitates autonomous vehicle services. As an example, the service entity can facilitate provision of both first-party and third-party autonomous vehicle services (e.g., delivery services, transportation services, courier services, aerial transportation services, etc.). Additionally, in some implementations, the autonomous vehicle can be associated with the service entity (e.g., a first-party autonomous vehicle of the service entity, a third-party autonomous vehicle of a vehicle provider that provides services facilitated by the service entity, etc.). Alternatively, in some implementations, the computing system can be or otherwise include an autonomous vehicle computing system of the autonomous vehicle that is configured to implement various autonomous vehicle systems (e.g., motion planning system(s), perception system(s), prediction system(s), etc.).

Figure 6:
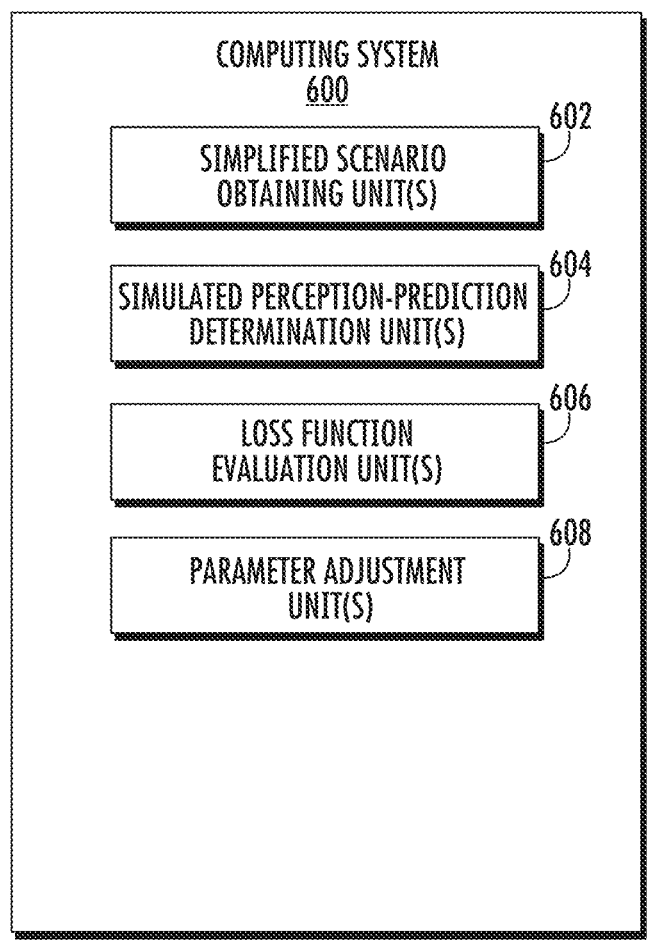
FIG. 6 depicts example system units for performing operations and functions according to example embodiments of the present disclosure.

Various means can be configured to perform the methods and processes described herein. FIG. 6 depicts example units associated with a computing system 600 for performing operations and functions according to example embodiments of the present disclosure. As depicted, FIG. 6 depicts a computing system 600 that can include, but is not limited to, simplified scenario obtaining unit(s) 602; simulated perception-prediction determination unit(s) 604; loss function evaluation unit(s) 606; and parameter adjustment unit unit(s) 608. In some implementations, one or more of the units may be implemented separately. In some implementations, one or more units may be a part of or included in one or more other units. These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry, for example. The means can include or otherwise be able to access memory such as, for example, one or more non-transitory computer-readable storage media, such as random-access memory, read-only memory, electrically erasable programmable read-only memory, erasable programmable read-only memory, flash/other memory device(s), data registrar(s), database(s), and/or other suitable hardware.

The means can be programmed to perform one or more algorithm(s) for carrying out the operations and functions described herein. For instance, the means can be configured to obtain simplified scenario data (e.g., representing an intermediate output associated with a scenario for a perception system and a prediction system of an autonomous vehicle, etc.). A simplified scenario obtaining unit 602 is an example of means for obtaining simplified scenario data as described herein.

The means can be configured to determine a simulated perception-prediction output. For example, the means can be configured to utilize a machine-learned perception-prediction simulation model to determine, based on obtained simplified scenario data, a simulated perception-prediction output that includes simulated perception data and simulated prediction data. A simulated perception-prediction determination unit 604 is one example of a means for determining a simulated perception-prediction output as described herein.

The means can be configured to evaluate a loss function. For example, the means can be configured to evaluate a loss function including a perception loss term that evaluates a difference between the simulated perception data and ground truth perception data and a prediction loss term that evaluates a difference between the simulated prediction data and ground truth prediction data. A loss function evaluation unit 606 is one example of a means for evaluating a loss function as described herein.

The means can be configured to adjust one or more parameters of a machine-learned model. For example, the means can be configured to adjust one or more parameters of a machine-learned perception-prediction simulation model based at least in part on a loss function. A parameter adjustment unit 608 is one example of a means for adjusting one or more parameters of a machine-learned model as described herein.

Figure 7:
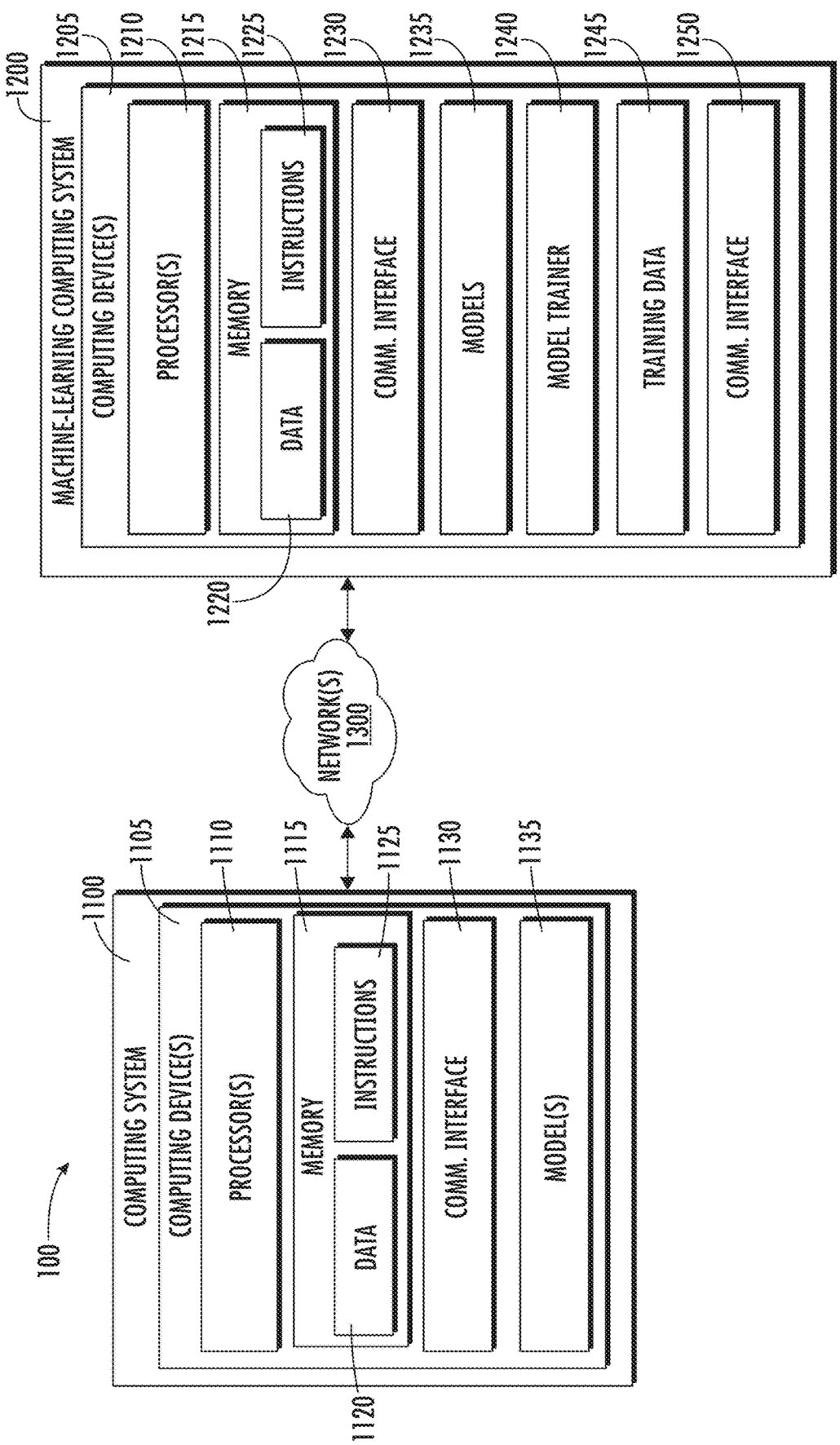
FIG. 7 depicts example system components of an example computing system according to example embodiments of the present disclosure.

FIG. 7 depicts a block diagram of an example computing system 1000 according to example embodiments of the present disclosure. The example system 1000 includes a computing system 1100 and a machine learning computing system 1200 that are communicatively coupled over one or more networks 1300.

In some implementations, the computing system 1105 can operate to process data (e.g., sensor data, perception-prediction output data, etc.) using one or more vehicle system(s) (e.g., a motion planning system, a perception system, a prediction system, etc.). In some implementations, the computing system 1105 can be included in an autonomous vehicle. For example, the computing system 1105 can be on-board the autonomous vehicle. In other implementations, the computing system 1105 is not located on-board the autonomous vehicle. For example, the computing system 1105 can operate offline to perform training and/or utilization of a machine-learned perception-prediction simulation model. The computing system 1105 can include one or more distinct physical computing devices.

The computing system 1105 can include one or more processors 1110 and a memory 1115. The one or more processors 1110 can be any suitable processing device (e.g., a processor core, a microprocessor, an ASIC, a FPGA, a controller, a microcontroller, etc.) and can be one processor or a plurality of processors that are operatively connected. The memory 1115 can include one or more non-transitory computer-readable storage media, such as RAM, ROM, EEPROM, EPROM, one or more memory devices, flash memory devices, etc., and combinations thereof.

The memory 1115 can store information that can be accessed by the one or more processors 1110. For instance, the memory 1115 (e.g., one or more non-transitory computer-readable storage mediums, memory devices) can store data 1120 that can be obtained, received, accessed, written, manipulated, created, and/or stored. The data 1120 can include, for instance, sensor data, simplified scenario data, prediction data, simulated prediction data, perception data, simulated perception data, etc. as described herein. In some implementations, the computing system 1100 can obtain data from one or more memory device(s) that are remote from the computing system 1100.

The memory 1115 can also store computer-readable instructions 1125 that can be executed by the one or more processors 1120. The instructions 1125 can be software written in any suitable programming language or can be implemented in hardware. Additionally, or alternatively, the instructions 1125 can be executed in logically and/or virtually separate threads on processor(s) 1110.

For example, the memory 1115 can store instructions 1125 that when executed by the one or more processors 1110 cause the one or more processors 1110 (the computing system) to perform any of the operations and/or functions described herein, including, for example, processing data (e.g., sensor data, perception-prediction output data, etc.) using one or more autonomous vehicle system(s) (e.g., a motion planning system, a perception system, a prediction system, etc.), training and/or utilization of a machine-learned perception-prediction simulation model, testing of one or more system(s) of an autonomous vehicle (e.g., a motion planning system, etc.).

According to an aspect of the present disclosure, the computing system 1105 can store or include one or more machine-learned models 1135. As examples, the machine-learned models 1135 can be or can otherwise include various machine-learned models such as, for example, neural networks (e.g., deep neural networks), support vector machines, convolutional neural networks (e.g., dual-head convolutional neural network(s), etc.), decision trees, ensemble models, k-nearest neighbors models, Bayesian networks, or other types of models including linear models and/or non-linear models. Example neural networks include feed-forward neural networks, recurrent neural networks (e.g., long short-term memory recurrent neural networks), convolutional neural networks, or other forms of neural networks.

In some implementations, the computing system 1100 can receive the one or more machine-learned models 1135 from the machine learning computing system 1200 over network(s) 1300 and can store the one or more machine-learned models 1135 in the memory 1115. The computing system 1100 can then use or otherwise implement the one or more machine-learned models 1135 (e.g., by processor(s) 1110). In particular, the computing system 1100 can implement the machine learned model(s) 1135 to test various autonomous vehicle system(s) (e.g., motion planning system(s), etc.).

The machine learning computing system 1200 can include one or more computing devices 1205. The machine learning computing system 1200 can include one or more processors 1210 and a memory 1215. The one or more processors 1210 can be any suitable processing device (e.g., a processor core, a microprocessor, an ASIC, a FPGA, a controller, a microcontroller, etc.) and can be one processor or a plurality of processors that are operatively connected. The memory 1215 can include one or more non-transitory computer-readable storage media, such as RAM, ROM, EEPROM, EPROM, one or more memory devices, flash memory devices, etc., and combinations thereof.

The memory 1215 can store information that can be accessed by the one or more processors 1210. For instance, the memory 1215 (e.g., one or more non-transitory computer-readable storage mediums, memory devices) can store data 1220 that can be obtained, received, accessed, written, manipulated, created, and/or stored. The data 1220 can include, for instance, sensor data, simplified scenario data, prediction data, simulated prediction data, perception data, simulated perception data, ground truth label(s), etc. as described herein. In some implementations, the machine learning computing system 1200 can obtain data from one or more memory device(s) that are remote from the machine learning computing system 1200.

The memory 1210 can also store computer-readable instructions 1225 that can be executed by the one or more processors 1210. The instructions 1225 can be software written in any suitable programming language or can be implemented in hardware. Additionally, or alternatively, the instructions 1225 can be executed in logically and/or virtually separate threads on processor(s) 1210.

For example, the memory 1215 can store instructions 1225 that when executed by the one or more processors 1210 cause the one or more processors 1210 (the computing system) to perform any of the operations and/or functions described herein, including, for example, training and/or utilization of a machine-learned perception-prediction simulation model.

In some implementations, the machine learning computing system 1200 includes one or more server computing devices. If the machine learning computing system 1200 includes multiple server computing devices, such server computing devices can operate according to various computing architectures, including, for example, sequential computing architectures, parallel computing architectures, or some combination thereof.

In addition or alternatively to the model(s) 1235 at the computing system 1100, the machine learning computing system 1200 can include one or more machine-learned models 1235. As examples, the machine-learned models 1235 can be or can otherwise include various machine-learned models such as, for example, neural networks (e.g., deep neural networks), convolutional neural network(s) (e.g., dual-head architecture network(s), etc.), support vector machines, decision trees, ensemble models, k-nearest neighbors models, Bayesian networks, or other types of models including linear models and/or non-linear models. Example neural networks include feed-forward neural networks, recurrent neural networks (e.g., long short-term memory recurrent neural networks), convolutional neural networks, or other forms of neural networks.

As an example, the machine learning computing system 1200 can communicate with the computing system 1100 according to a client-server relationship. For example, the machine learning computing system 1200 can implement the machine-learned models 1235 to provide a web service to the computing system 1100. For example, the web service can provide training and/or utilization of a machine-learned perception-prediction simulation model, and/or testing of various vehicle system(s) (e.g., motion planning system(s), etc.).

Thus, machine-learned models 1135 can located and used at the computing system 1100 and/or machine-learned models 1235 can be located and used at the machine learning computing system 1200.

In some implementations, the machine learning computing system 1200 and/or the computing system 1100 can train the machine-learned models 1135 and/or 1140 through use of a model trainer 1240. The model trainer 1240 can train the machine-learned models 1135 and/or 1240 using one or more training or learning algorithms. One example training technique is backwards propagation of errors. In some implementations, the model trainer 1240 can perform supervised training techniques using a set of labeled training data. In other implementations, the model trainer 1240 can perform unsupervised training techniques using a set of unlabeled training data. The model trainer 1240 can perform a number of generalization techniques to improve the generalization capability of the models being trained. Generalization techniques include weight decays, dropouts, or other techniques.

In particular, the model trainer 1240 can train a machine-learned model 1135 and/or 1140 based on a set of training data 1245. The training data 1245 can include, for example, ground truth perception label(s), ground truth prediction label(s), perception outputs, prediction outputs, etc. The model trainer 1240 can be implemented in hardware, firmware, and/or software controlling one or more processors.

The computing system 1100 and the machine learning computing system 1200 can each include a communication interface 1130 and 1250, respectively. The communication interfaces 1130/1250 can used to communicate with one or more systems or devices, including systems or devices that are remotely located from the computing system 1100 and the machine learning computing system 1200. A communication interface 1130/1250 can include any circuits, components, software, etc. for communicating with one or more networks (e.g., 1300). In some implementations, a communication interface 1130/1250 can include, for example, one or more of a communications controller, receiver, transceiver, transmitter, port, conductors, software and/or hardware for communicating data.

The network(s) 1300 can be any type of network or combination of networks that allows for communication between devices. In some embodiments, the network(s) can include one or more of a local area network, wide area network, the Internet, secure network, cellular network, mesh network, peer-to-peer communication link and/or some combination thereof and can include any number of wired or wireless links. Communication over the network(s) 1300 can be accomplished, for instance, via a network interface using any type of protocol, protection scheme, encoding, format, packaging, etc.

FIG. 7 illustrates one example computing system 1000 that can be used to implement the present disclosure. Other computing systems can be used as well. For example, in some implementations, the computing system 1100 can include the model trainer 1240 and the training dataset 1245. In such implementations, the machine-learned models 1240 can be both trained and used locally at the computing system 1100. As another example, in some implementations, the computing system 1100 is not connected to other computing systems.

In addition, components illustrated and/or discussed as being included in one of the computing systems 1100 or 1200 can instead be included in another of the computing systems 1100 or 1200. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks and/or operations can be performed sequentially or in parallel. Data and instructions can be stored in a single memory device or across multiple memory devices.

Computing tasks discussed herein as being performed at computing device(s) remote from the vehicle can instead be performed at the vehicle (e.g., via the vehicle computing system), or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks and/or operations can be performed sequentially or in parallel. Data and instructions can be stored in a single memory device or across multiple memory devices.

While the present subject matter has been described in detail with respect to specific example embodiments and methods thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computing system, comprising:
   one or more processors;
   a machine-learned perception-prediction simulation model configured to simulate a perception system and a prediction system of an autonomous vehicle, comprising:
      a perception submodel configured to process simplified scenario data to obtain simulated perception data; and a prediction submodel configured to process the simplified scenario data and the simulated perception data to obtain simulated prediction data; and one or more tangible, non-transitory computer readable media storing computer-readable instructions that when executed by the one or more processors cause the one or more processors to perform operations, the operations comprising:

obtaining the simplified scenario data associated with a simulated scenario for the perception system and the prediction system of the autonomous vehicle, wherein the simplified scenario data comprises a simplified entity representation for a simulated entity, wherein the simulated entity is derived from a bounding box, and wherein the bounding box is based on a user-generated sketch sketched via a user input device, and wherein the user-generated sketch is indicative of the bounding box and one or more characteristics of the simulated entity represented by the simplified entity representation;

determining, using the machine-learned perception-prediction simulation model, a simulated perception-prediction output based at least in part on the simplified scenario data, wherein the simulated perception-prediction output comprises the simulated perception data and the simulated prediction data, and wherein the simulated prediction data comprises a prediction for the simulated entity;

providing the simulated perception-prediction output to a motion planning system of the autonomous vehicle; and in response to providing the simulated perception-prediction output, obtaining a motion plan output from the motion planning system of the autonomous vehicle.

2. The computing system of claim 1, wherein the operations further comprise determining a performance metric associated with the motion plan output.

3. The computing system of claim 1, wherein the motion planning system comprises one or more machine-learned motion planning models; and wherein the operations further comprise:
evaluating a loss function that evaluates a difference between the motion plan output and a ground truth label;
determining, based at least in part on the loss function, one or more parameter adjustments for at least one of the one or more machine-learned motion planning models; and
providing the one or more parameter adjustments to the motion planning system.

4. The computing system of claim 1, wherein:
the computing system comprises a service entity computing system; and
the autonomous vehicle is configured to provide one or more services facilitated by the service entity.

5. The computing system of claim 1, wherein the computing system comprises an autonomous vehicle computing system of the autonomous vehicle.

6. The computing system of claim 1, wherein determining, using the machine-learned perception-prediction simulation model, the simulated perception-prediction output based at least in part on the simplified scenario data comprises:

determining, using the perception submodel of the machine-learned perception-prediction simulation model, the simulated perception data based at least in part on the simplified scenario data; and determining, using the prediction submodel of the machine-learned perception-prediction simulation model, the simulated prediction data based at least in part on the simplified scenario data and the simulated perception data.

7. The computing system of claim 6, wherein the simulated perception data comprises one or more simulated bounding boxes for one or more respective predicted entities of the simplified scenario data; and wherein determining, using the prediction submodel of the machine-learned perception-prediction simulation model, the simulated prediction data based at least in part on the simplified scenario data and the simulated perception data comprises:

determining one or more feature vectors respectively descriptive of the one or more simulated bounding boxes; and determining, using the prediction submodel of the machine-learned perception-prediction simulation model, the simulated prediction data based at least in part on the one or more feature vectors, wherein the simulated prediction data comprises one or more future state predictions for each of the one or more simulated bounding boxes.

8. A computer-implemented method, comprising:

obtaining, by a computing system comprising one or more computing devices, simplified scenario data associated with a simulated scenario, wherein the simplified scenario data comprises a simplified entity representation for a simulated entity, wherein the simulated entity is derived from a bounding box, and wherein the bounding box is based on a user-generated sketch sketched via a user input device, and wherein the user-generated sketch is indicative of the bounding box and one or more characteristics of the simulated entity represented by the simplified entity representation;

determining, by the computing system using a machine-learned perception-prediction simulation model, a simulated perception-prediction output based at least in part on the simplified scenario data, wherein the simulated perception-prediction output comprises simulated perception data and simulated prediction data, wherein the machine-learned perception-prediction simulation model is configured to simulate a perception system and a prediction system of an autonomous vehicle, and wherein the simulated perception-prediction output comprises a prediction for the simulated entity;

evaluating, by the computing system, a loss function comprising a perception loss term and a prediction loss term, wherein the perception loss term evaluates a difference between the simulated perception data and ground truth perception data and the prediction loss term evaluates a difference between the simulated prediction data and ground truth prediction data; and adjusting, by the computing system, one or more parameters of the machine-learned perception-prediction simulation model based at least in part on the loss function.

9. The computer-implemented method of claim 8, wherein determining, by the computing system using the machine-learned perception-prediction simulation model, the simulated perception-prediction output based at least in part on the simplified scenario data comprises:

determining, by the computing system using a perception submodel of the machine-learned perception-prediction simulation model, the simulated perception data based at least in part on the simplified scenario data, wherein the simulated prediction data comprises the prediction for the simulated entity; and determining, by the computing system using a prediction submodel of the machine-learned perception-prediction simulation model, the simulated prediction data based at least in part on the simplified scenario data and the simulated perception data.

10. The computer-implemented method of claim 9, wherein the simulated perception data comprises one or more simulated bounding boxes for one or more respective predicted objects of the simplified scenario data; and wherein determining, by the computing system using the prediction submodel of the machine-learned perception-prediction simulation model, the simulated prediction data based at least in part on the simplified scenario data and the simulated perception data comprises:

determining, by the computing system, one or more feature vectors respectively descriptive of the one or more simulated bounding boxes; and determining, by the computing system using the prediction submodel of the machine-learned perception-prediction simulation model, the simulated prediction data based at least in part on the one or more feature vectors, wherein the simulated prediction data comprises one or more future state predictions for each of the one or more simulated bounding boxes.

11. The computer-implemented method of claim 10, wherein:

the one or more bounding boxes comprises a plurality of bounding boxes; and a future state prediction for a first simulated bounding box is based at least in part on a future state prediction of a second simulated bounding box of the plurality of simulated bounding boxes.

12. The computer-implemented method of claim 9, wherein:

the perception submodel comprises a convolutional neural network; and the prediction submodel comprises a multi-layer perceptron.

13. The computer-implemented method of claim 8, wherein:

the ground truth perception data comprises a perception output of the perception system of the autonomous vehicle;

the ground truth prediction data comprises a prediction output of the prediction system of the autonomous vehicle; and the perception output and the prediction output are based at least in part on sensor data associated with the simulated scenario.

14. The computer-implemented method of claim 13, wherein:

the perception output of the perception system comprises a false positive bounding box; and at least one of the one or more simulated bounding boxes comprises a simulated false positive bounding box.

15. The computer-implemented method of claim 8, wherein the operations further comprise:

obtaining, by the computing system, additional simplified scenario data associated with an additional simulated scenario;

determining, by the computing system using the machine-learned perception-prediction simulation model, an additional simulated perception output and an additional simulated prediction output based at least in part on the additional simplified scenario data; and providing, by the computing system, the additional simulated perception output and the additional simulated prediction output to a motion planning system of the autonomous vehicle.

16. The computer-implemented method of claim 8, wherein the simulated scenario represents an intermediate output associated with a scenario for a perception system and a prediction system of an autonomous vehicle.

17. The computer-implemented method of claim 8, wherein the simplified scenario data comprises:

high-definition mapping data of an area of a transportation network associated with the simulated scenario;

the simplified entity representation, wherein the simplified entity representation is located within the area of the transportation network, and wherein the entity representation comprises the bounding box; and metadata descriptive of at least a starting state and a planned route of the autonomous vehicle.

18. The computer-implemented method of claim 17, wherein, prior to determining the simulated perception-prediction output, the method comprises determining, by the computing system, one or more occlusion masks based at least in part on a location of at least the autonomous vehicle in the area of the transportation network; and wherein the simplified scenario data further comprises the one or more occlusion masks.

19. One or more tangible, non-transitory computer readable media storing computer-readable instructions that when executed by one or more processors cause the one or more processors to perform operations, the operations comprising:

obtaining simplified scenario data that represents an intermediate output associated with a simulated scenario for a perception system and a prediction system of an autonomous vehicle, wherein the simplified scenario data comprises a simplified entity representation for a simulated entity, wherein the simulated entity is derived from a bounding box, and wherein the bounding box is based on a user-generated sketch sketched via a user input device, and wherein the user-generated sketch is indicative of the bounding box and one or more characteristics of the simulated entity represented by the simplified entity representation;

processing the simplified scenario data with a perception submodel of a machine-learned perception-prediction simulation model to obtain simulated perception data, wherein the machine-learned perception-prediction simulation model is configured to simulate the perception system and the prediction system of the autonomous vehicle, and wherein the simulated prediction data comprises a prediction for the simulated entity;

processing the simplified scenario data and the simulated perception data with a prediction submodel of the machine-learned perception-prediction simulation model to obtain simulated prediction data;

evaluating a loss function comprising a perception loss term and a prediction loss term, wherein the perception loss term evaluates a difference between the simulated perception data and ground truth perception data and the prediction loss term evaluates a difference between the simulated prediction data and ground truth prediction data; and adjusting one or more parameters of the machine-learned perception-prediction simulation model based at least in part on the loss function.

20. The one or more tangible, non-transitory media of claim 19, wherein the simulated perception data comprises one or more simulated bounding boxes for one or more respective predicted entities of the simplified scenario data; and wherein processing, by the computing system, the simplified scenario data and the simulated perception output with the prediction submodel comprises:
determining one or more feature vectors respectively descriptive of the one or more simulated bounding boxes; and
processing the one or more feature vectors with the prediction submodel of the machine-learned perception-prediction simulation model to obtain the simulated prediction data, wherein the simulated prediction data comprises one or more future state predictions for each of the one or more simulated bounding boxes.

* * * * *